United States Patent
Dice et al.

(10) Patent No.: US 11,972,777 B2
(45) Date of Patent: Apr. 30, 2024

(54) READER BIAS BASED LOCKING TECHNIQUE ENABLING HIGH READ CONCURRENCY FOR READ-MOSTLY WORKLOADS

(71) Applicant: Oracle International Corporation, Redwood City, CA (US)

(72) Inventors: David Dice, Foxboro, MA (US); Alex Kogan, Needham, MA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 18/174,520

(22) Filed: Feb. 24, 2023

(65) Prior Publication Data

US 2023/0206953 A1 Jun. 29, 2023

Related U.S. Application Data

(63) Continuation of application No. 17/507,714, filed on Oct. 21, 2021, now Pat. No. 11,594,252, which is a continuation of application No. 17/020,655, filed on Sep. 14, 2020, now Pat. No. 11,170,816, which is a continuation of application No. 16/739,851, filed on
(Continued)

(51) Int. Cl.
*G11B 20/10* (2006.01)
*G06F 9/52* (2006.01)
*G06F 16/23* (2019.01)
*G11B 20/18* (2006.01)
*G11C 16/26* (2006.01)

(52) U.S. Cl.
CPC ........ *G11B 20/10268* (2013.01); *G06F 9/526* (2013.01); *G06F 16/2343* (2019.01); *G06F 16/2365* (2019.01); *G11B 20/105* (2013.01); *G11C 16/26* (2013.01)

(58) Field of Classification Search
CPC .. G11B 5/00; G11B 5/09; G11B 20/18; G11B 20/10; G11B 20/105; G11B 20/10268; G06F 9/526; G06F 16/2343; G06F 16/2365
USPC ............................................... 360/24, 31, 53
See application file for complete search history.

(56) References Cited

U.S. PATENT DOCUMENTS 7,934,062 B2 4/2011 McKenney et al.
9,329,895 B2 5/2016 Steinmacher-Burow
(Continued)

OTHER PUBLICATIONS

U.S. Appl. No. 16/203,511, filed Nov. 28, 2018, Alex Kogan.
(Continued)

*Primary Examiner* — Nabil Z Hindi
(74) *Attorney, Agent, or Firm* — Robert C. Kowert; Kowert, Hood, Munyon, Rankin & Goetzel, P.C.

(57) ABSTRACT

A data object has a lock and a condition indicator associated with it. Based at least partly on detecting a first setting of the condition indicator, a reader stores an indication that the reader has obtained read access to the data object in an element of a readers structure and reads the data object without acquiring the lock. A writer detects the first setting and replaces it with a second setting, indicating that the lock is to be acquired by readers before reading the data object. Prior to performing a write on the data object, the writer verifies that one or more elements of the readers structure have been cleared.

20 Claims, 13 Drawing Sheets

Related U.S. Application Data

Jan. 10, 2020, now Pat. No. 10,811,049, which is a continuation of application No. 16/290,431, filed on Mar. 1, 2019, now Pat. No. 10,535,368.

(60) Provisional application No. 62/734,197, filed on Sep. 20, 2018.

(56) References Cited

U.S. PATENT DOCUMENTS

| | | | |
|---|---|---|---|
| 9,824,018 | B2 | 11/2017 | Joshi et al. |
| 9,910,893 | B2* | 3/2018 | Li ............... G06F 16/24552 |
| 10,535,368 | B1 | 1/2020 | Dice |
| 11,594,252 | B2 | 2/2023 | Dice et al. |
| 2007/0165319 | A1 | 7/2007 | Fisher |
| 2020/0411049 | A1 | 12/2020 | Dice et al. |

OTHER PUBLICATIONS

Bjorn B. Brandenburg, et al., "Spin-Based Reader-Writer Synchronization for Multiprocessor Real-Time Systems", In Real-Time Systems Journal, Sep. 2010, pp. 1-61.
Irina Calciu, et al., "NUMA-Aware Reader-Writer Locks", ACM, PPoPP'13, Feb. 23-27, 2013, pp. 157-166.
Jonathan Corbert, "Big reader locks", Retrieved from https://lwn.net/Articles/378911, Mar. 16, 2010, pp. 1-2.
Luke Dalessandro, et al., "Hybrid NOrec: A Case Study in the Effectiveness of Best Effort Hardware Transactional Memory", ACM, ASPLOS'11, Mar. 5-11, 2011, pp. 39-51.
Peter Damron, et al., "Hybrid Transactional Memory", In Proceedings of the 12th International Conference on Architectural Support for Programming Languages and Operating Systems (ASPLOS), 2006, pp. 336-346.
Dave Dice, et al., "Refined Transactional Lock Elision", In Proceedings of the 21st ACM SIGPLAN Symposium on Principles and Practice of Parallel Programming (PPOPP), 2016, pp. 1-12.
Alex Kogan, et al., "A Methodology for Creating Fast Wait-Free Data Structures", In Proceedings of the 17th ACM SIGPLAN Symposium on Principles and Practice of Parallel Programming, Feb. 2012, pp. 141-150.
Yossi Lev, et al., "Scalable Reader-Writer Locks", ACM, SPAA'09, Aug. 11-13, 2009, pp. 1-10.
Ran Liu, et al, "Scalable Read-mostly Synchronization Using Passive Reader-Writer Locks", In Proceedings of the USENIX Annual Technical Conference (ATC), 2014, pp. 219-230.
Nick Piggin, "kernel: introduce brlock", Retrieved from https://lwn.net/Articles/378781, Mar. 16, 2010, pp. 1-3.
"Distributed Cache-Line Counter Scalable RW-Lock", Retrieved from http://concurrencyfreaks.blogspot.com/2013/09/distributed-cache-line-counter-scalable.html, Sep. 1, 2013, pp. 1-6.
Yehuda Afek, et al., "Cache Index-Aware Memory Allocation", ACM, ISMM'11, Jun. 2011, pp. 1-10.
Jonathan Corbert, "Driver porting: mutual exclusion with seqlocks", Retrieved from https://lwn.net/Articles/378911, 2010, pp. 1-2.
Mathieu Desnoyers, et al., "User-Level Implementations of Read-Copy Update", IEEE Transactions on Parallel and Distributed Systems, 2009, pp. 1-14.
Dave Dice et al, "Lightweight Contention Management for Efficient Compare-and-Swap Operations", dated May 24, 2013, pp. 1-25.
Dave Dice et al, "Scalable Statistics Counters", dated Jun. 23-25, 2013, pp. 1-10.
Dave Dice et al, "Early Experience with a commercial Hardware Transactional Memory Implementation", dated Oct. 2009, pp. 1-60.
David Dice, et al., "Lock Cohorting: A General Technique for Designing NUMA Locks", ACM, Transactions on Parallel Computing, vol. 1, No. 2, Article 13, Jan. 2015, pp. 13:1-13:42.
David Dice, "Quickly reacquirable locks", Retrieved from https://patents.google.com/patent/US7814488, 2002, pp. 1.
Pascal Felber, et al., "Hardware Read-Write Lock Elision", EuroSys'16, Apr. 2016, pp. 1-15.
Wilson C. Hsieh, et al., "Scalable Reader-Writer Locks for Parallel Systems", In Proceedings Sixth International Parallel Processing Symposium, 1992, pp. 1-19.
Andi Kleen, "Lock elision in the GNU C library", Retrieved from https://lwn.net/Articles/534758, Jan. 30, 2013, pp. 1-7.
Christoph Lameter, "Effective Synchronization on Linux/NUMA Systems", Gelato Conference 2005, pp. 1-23.
George Marsaglia, "Xorshift RNGs", Journal of Statistical Software Articles, 2003, Retrieved from https://doi.org/10.18637/jss.v008.i14, pp. 1-6.
John M. Mello-Crummey, et al., "Scalable Reader-Writer Synchronization for Shared-Memory Multiprocessors", In Proceedings of the Third ACM SIGPLAN Symposium on Principles and Practice of Parallel Programming (PPOPP 91), ACM, 1991, pp. 106-113.
Oracle, "Class StampedLock", Retrieved from https://docs.oracle.com/javase/8/docs/api/java/util/concurrent/locks/StampedLock.html, 2012, pp. 1-13.
Filip Pizlo, et al., "Fine-grained Adaptive Biased Locking", ACM, PPPJ'11, Aug. 2011, pp. 1-11.
Ravi Rajwar, et al., "Speculative Lock Elision: Enabling Highly Concurrent Multithreaded Execution", In Proceedings of the 34th Annual ACM/IEEE International Symposium on Microarchitecture (MICRO 34), IEEE Computer Society, 2001, pp. 1-9.
"A persistent key-value store for fast storage environments", Retrieved from www.rocksdb.org, 2018, pp. 1.
Kenneth Russell, et al., "Eliminating Synchronization-Related Atomic Operations with Biased Locking and Bulk Rebiasing", ACM, OOPSLA'06, Copyright Sun Microsystems, Inc., Oct. 2006, pp. 1-9.
Jun Shirako, et al., "Design, Verification and Applications of a New Read-Write Lock Algorithm", ACM, SPAA'12, Jun. 25-27, 2012, pp. 1-10.
Nalini Vasedevan, et al., "Simple and Fast Biased Locks", ACM, PACT'10, Sep. 11-15, 2010, pp. 1-9.
D. Vyukov, "Distributed Reader-Writer Mutex", Retrieved from http://www.1024cores.ent/home/lock-free-algorithms/reader-writer-mutex, 2011, pp. 1-7.
Wikipedia, "Loss aversion", Retrieved from https://en.wikipeida.org/wiki/Loss_aversion on Jul. 25, 2019, pp. 1-12.
Wikipedia, "Ski rental problem", Retrieved from https://en.wikipedia.org/w/index.php?title=Ski_rental_problem&oldid = . . . on Jul. 25, 2019, pp. 1-4.
Wikipedia, "Birthday problem", Retrieved from https://en.wikipedia.org/w/index.php?title=Birthday_problem&oldid=85 . . . on Jul. 25, 2019, pp. 1-10.
David Dice, "Biased Locking in HotSpot", Aug. 18, 2006, Retrieved from https://blogs.oracle.com/dave/biased-locking-in-hotspot, pp. 1-8.

* cited by examiner

Global lock (GL) 435

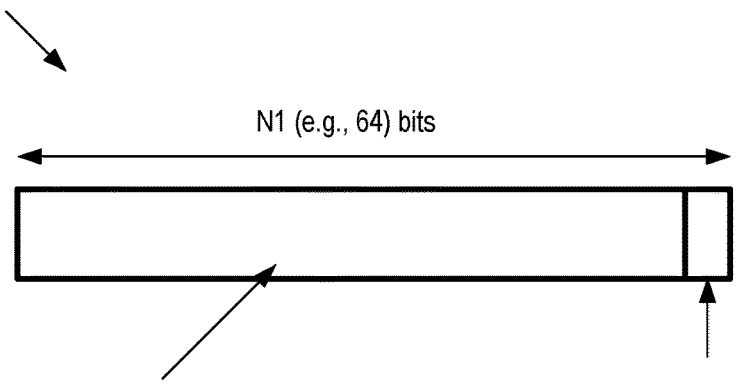

N1 (e.g., 64) bits

Remaining portion 442 may be used by readers to signal obtained read access, e.g., using compare-and-swap to increment a counter represented within remaining portion Least significant bit 440 of GL may be used by writers as a reader blocking indicator (e.g., '1' == BLOCKED, '0' == UNBLOCKED)

Non-global lock (NGL) 470 (e.g., per-CPU or per-thread lock)

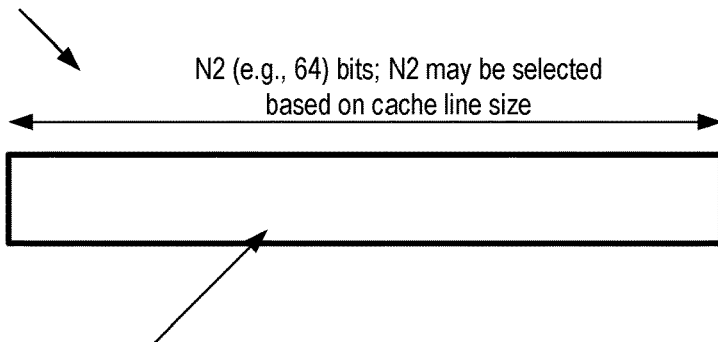

N2 (e.g., 64) bits; N2 may be selected based on cache line size

Identifier 472 of acquiring data accessor (reader or writer) may be stored to indicate ownership, e.g., using compare-and-swap

FIG. 4

READER BIAS BASED LOCKING TECHNIQUE ENABLING HIGH READ CONCURRENCY FOR READ-MOSTLY WORKLOADS

This application is a continuation of U.S. patent application Ser. No. 17/507,714, filed Oct. 21, 2021, which is a continuation of U.S. patent application Ser. No. 17/020,655, filed Sep. 14, 2020, now U.S. Pat. No. 11,170,816, which is a continuation of U.S. patent application Ser. No. 16/739,851, filed Jan. 10, 2020, now U.S. Pat. No. 10,811,049, which is a continuation of U.S. application Ser. No. 16/290,431, filed Mar. 1, 2019, now U.S. Pat. No. 10,535,368, which claims benefit of priority to U.S. Provisional Application Ser. No. 62/734,197, filed Sep. 20, 2018, which are hereby incorporated by reference in their entirety.

BACKGROUND

In many computer applications, reader-writer locks are used to protect data to which multiple readers and/or writers may attempt to obtain access, especially in scenarios in which reads are more frequent that writes. In some reader-writer locking techniques, lock acquisition times for a writer may become quite long, potentially resulting in excessive wait times for readers even before the writer begins its critical section. Designers of reader-writer locks may also confront other trade-offs related to reader scalability. Locks that have a compact memory representation for active readers may sometimes suffer under high intensity read-dominated workloads when a "reader indicator" state has to be updated frequently by a diverse set of threads. Techniques that use purely distributed reader indicators (such as one spin lock per CPU on a multi-CPU system) may in turn suffer from problems associated with larger lock size, preclusion of the option of static lock allocation, extra levels of indirection, and so on.

SUMMARY

Various embodiments of systems, apparatus and methods for locking techniques that support high levels of read concurrency in the context of read-mostly workloads are described. According to some embodiments, a data object that may be read and/or written by a plurality of data accessors has a lock and a condition indicator (e.g., a Boolean flag which may be referred to as a "reader bias" indicator) associated with it. The setting of the condition indicator may be used to determine whether a reader can employ a fast path (which does not require acquisition of the lock) or a potentially less efficient path (involving the acquisition of the lock) to obtain read access to the data object. Such a technique may be referred to as a reader bias based locking technique in various embodiments. According to at least one embodiment, a method may comprise detecting, by a reader which is a member of a set of data accessors at one or more computing devices, a first setting of a condition indicator associated with a first data object. In various embodiments, the first setting may indicate that the fast path option is available to the reader with respect to the first data object. The method may include storing, by the reader in an element of a readers data structure (which may be referred to as a "visible readers" structure in some embodiments, as it may indicate the existence of current or active readers of one or more data objects), an indication that the reader has obtained read access to the first data object. The method may further comprise clearing, by the reader, the element of the readers data structure after the reader completes one or more read operations, without acquiring the lock associated with the first data object. The method may include examining, by a writer, the setting of the condition indicator before performing a write on the first data object in various embodiments. If the writer detects the first setting, the writer may replace the first setting by a second setting, in effect disabling the fast path for potential additional readers in such embodiments. In addition, according to some embodiments, the method may include verifying, by the writer prior to performing its writes, that one or more elements of the readers structure have been cleared.

In one embodiment, a system may comprise one or more computing devices. The devices may include instructions that upon execution on or across one or more processors cause a reader of a plurality of data accessors (which includes one or more readers and one or more writers) to detect a first setting of a condition indicator associated with a first data object. Based at least in part on the detection of the first setting, the instructions upon execution may cause the reader to store, in an element of a readers data structure, an indication that the first reader has obtained read access to the first data object. The instructions when executed may further cause the reader to clear the element of the readers data structure after the reader completes one or more read operations, without acquiring a lock associated with the first data object. Upon execution on or across the one or more processors, the instructions may cause a writer to detect the setting of the condition indicator before performing a write on the first data object in various embodiments. If the writer detects the first setting, the instructions when executed may cause the writer to replace the first setting by a second setting. In addition, according to some embodiments, the instructions, upon execution, may cause the writer to verify, by the writer prior to performing its writes, that one or more elements of the readers structure have been cleared.

According to at least some embodiments, one or more non-transitory computer-accessible storage media may store program instructions that when executed on or across one or more processors cause a reader of a plurality of data accessors which includes one or more readers and one or more writers to detect a first setting of a condition indicator associated with a first data object. Based at least in part on the detection of the first setting, the program instructions when executed may cause the reader to store, in an element of a readers data structure, an indication that the first reader has obtained read access to the first data object. The program instructions, when executed, may further cause the reader to clear the element of the readers data structure after the reader completes one or more read operations, without acquiring a lock associated with the first data object. When executed on or across the one or more processors, the program instructions, when executed, may cause a writer to detect the setting of the condition indicator before performing a write on the first data object in various embodiments. If the writer detects the first setting, the program instructions, when executed, may cause the writer to replace the first setting by a second setting. In addition, according to some embodiments, the program instructions, when executed, may cause the writer to verify, by the writer prior to performing a write operation directed to the first data object, that one or more elements of the readers structure have been cleared.

BRIEF DESCRIPTION OF THE DRAWINGS

FIG. 4 illustrates example contents of global and non-global locks which may be employed in a global secondary path algorithm, according to at least some embodiments.

While the invention is described herein by way of example for several embodiments and illustrative drawings, those skilled in the art will recognize that the invention is not limited to the embodiments or drawings described. It should be understood that the drawings and detailed description hereto are not intended to limit the invention to the particular form disclosed, but on the contrary, the invention is to cover all modifications, equivalents and alternatives falling within the spirit and scope of the present invention as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION OF EMBODIMENTS

Figure 1:
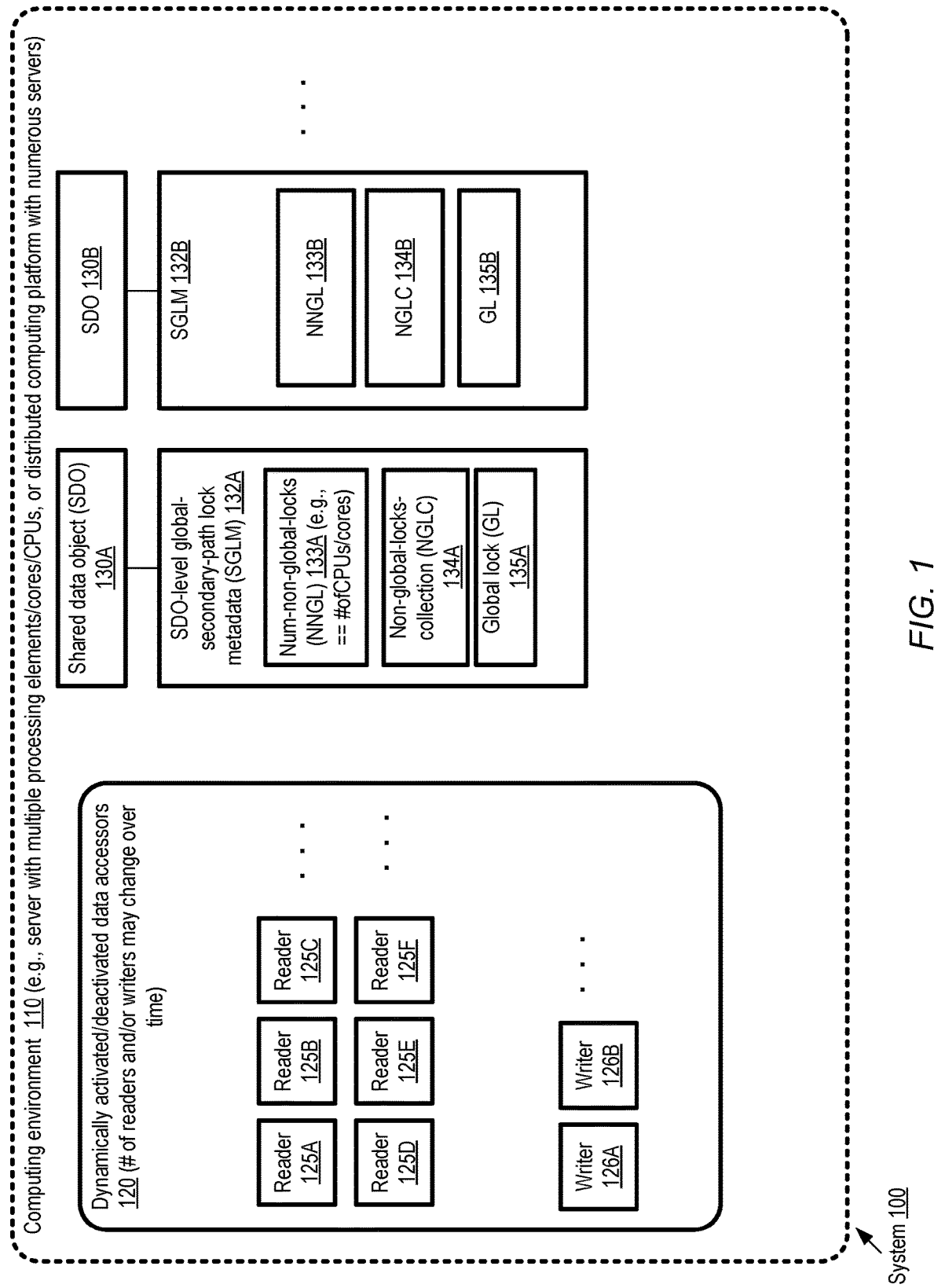
FIG. 1 illustrates an example system environment in which a global secondary path algorithm for accessing shared data objects may be implemented, according to at least some embodiments.

FIG. 1 illustrates an example system environment in which a global secondary path algorithm for accessing shared data objects may be implemented, according to at least some embodiments. Such an algorithm may be referred to as the GSP technique or algorithm in various embodiments. As shown, system 100 may comprise a computing environment 110, within which a set of data accessors 120 that may include some number of readers 125 (e.g., readers 125A—125F) and some number of writers 126 (e.g., writers 126A and 126B) may run. The computing environment may also comprise one or more shared data objects (SDOs) 130, such as SDO 130A and 130B, which may be read and/or modified at various points in time by the data accessors. In various embodiments, the number of readers 125 and/or writers 126 may change over time; for example, there may be intervals during which there no writes are being attempted or performed on a given SDO 130, periods during which no reads are being attempted or performed, periods in which numerous readers are attempting to concurrently or near-concurrently read from a given SDO, and so on. Data accessors may be dynamically activated and/or deactivated in at least some embodiments, e.g., by forking new threads or processes at a computing device or terminating such threads or processes. Similarly, the number of shared data objects may change over time as well in various embodiments. A given data accessor (such as a thread) may perform respective critical sections comprising read and/or write operations on numerous SDOs during its lifetime in the depicted embodiment, as well as other types of operations that are not part of critical sections. Thus, in such an embodiment, a data accessor may potentially change its role from a reader to a writer (and/or from a writer to a reader) as it progresses.

The computing environment 110 may comprise a single server or computing device in some embodiments (e.g., with one or more processing elements such as cores or CPUs), and multiple servers/computing devices in other embodiments. In at least some embodiments, the computing environment within which the data accessors 120 run and/or the shared data objects and associated metadata are stored may include one or more servers implementing a NUMA (non-uniform memory access) architecture. Individual ones of the SDOs 130 may be defined at any desired granularity in different embodiments—e.g., one SDO may comprise a 32-bit data structure, while another SDO may be a multi-megabyte data structure.

In the depicted embodiment, a respective set of locking-related metadata 132, used in the GSP algorithm, may be maintained or stored corresponding to individual ones of the SDOs—e.g., metadata 132A may be associated with SDO 130A, metadata 132B may be associated with SDO 130B, and so on. The locking metadata 132 associated with a given SDO may be referred to as the SDO-level global-secondary-path lock metadata (SGLM) for that SDO in the depicted embodiment. SGLM 132 for a given SDO 130 may comprise, for example, a global lock (GL) 135 (e.g., 135A or 135B), a collection of non-global locks (NGLC) 134 (e.g., 134A or 134B), and an indicator num-non-global-locks (NNGL) 133 (e.g., 133A or 133B) of the membership count of the NGLC collection. In some embodiments, in which for example the data accessors 120 run on a server with a plurality of CPUs or cores, at least one non-global-lock of the NGLC may be included corresponding to individual ones of the CPUs or cores. For example, in some implementations, an NGLC may comprise N locks if N CPUs (or cores, NUMA nodes or other processing elements) are available for the accessors to run on, with each of the non-global locks corresponding to one of the CPUs or processing elements. In other embodiments, the number of non-global locks (which may be as small as one) may not necessarily be dependent on the number of CPUs, cores, NUMA nodes etc. In at least one embodiment, NNGLs 133 may vary from one SGLM 132 to another; some SDOs may have fewer non-global locks than others. In some embodiments in which all the SDOs have the same number of non-global locks, NNGLs 133 may not be replicated within SGLMs 132—instead, for example, the number of non-global locks may be stored as a global variable.

Example pseudo-code set 1 (EPS1) shown below indicates, at a high level, one approach towards implementing the GSP algorithm which may be employed in some embodiments. A C++ style syntax is used in EPS1 by way of example; any appropriate programming language may be employed in various embodiments. In EPS1, readers and writers are assumed to be threads running within a single multi-CPU server, and the lock_t data structure (defined in lines 3-7) corresponds to the SGLM 132 shown in FIG. 1. The num_cpus variable of EPS1 corresponds to num-non-global-locks 133 of FIG. 1, the per_cpu_locks array corresponds to NGLC 134, and the global_lock corresponds to GL 135. Within EPS1, the tld_cpu variable defined on line 1 identifies the specific CPU on which a given thread happens to be running, the tld_tid variable is an identifier of the thread, "CAS" stands for an atomic compare-and-swap operation supported by the computing environment (e.g., via an opcode for an atomic instruction), "FAA" stands for an atomic fetch-and-add operation (e.g., via another opcode for another atomic instruction), and "CPU_PAUSE" is a no-op operation used to indicate busy waiting. In at least some implementations, several features not shown explicitly in EPS1, such as "volatile" variables, memory fences, and/or padding to avoid false sharing, may be employed. Note that in at least some implementations, CAS operations, FAA operations, CPU_PAUSE operations, and/or thread-level variables may not necessarily be used.

```
-----EPS1: Example pseudo-code set 1 for global-secondary-path (GSP) algorith------
 1:    __thread int tld_cpu = < CPU ID >;
 2:    __thread int tld_tid = < thread ID >;
 3:    typedef struct {
 4:        int num_cpus;
 5:        int *per_cpu_locks;
 6:        uint64_t global_lock ;
 7:    } lock_t ;
 8:    #define BLOCK_READERS (1)
 9:    // Reader functions
10:        int read_lock(lock_t *l) {
11:        while (1) {
12:        // try to acquire per-CPU lock first
13:        if (l→per_cpu_locks[tld_cpu] == 0 &&
14:            CAS(&l→per_cpu_locks[tld_cpu],0,tld_id)) return 0;
15:        while (1) {
16:            uint64_t glock = l→global_lock;
17:            if (glock & BLOCK_READERS) { // check block indicator/flag
18:                CPU_PAUSE( );
19:                break;
20:            }//end if
21:            // using counter within global lock, indicate read access is obtained
22:            if (CAS(&l→global_lock, glock, glock+2)) return 0;
23:            CPU_PAUSE( );
24:        } // end while
25:        } // end while
26:    } //end read_lock
27:    void read_unlock(lock_t *l) {
28:        if (l→per_cpu_locks[tld_cpu] == tld_id) // fast path was used
29:            l→per_cpu_locks[tld_cpu] = 0;
30:        else FAA(&l→global_lock,-2) // slow path was used, undo counter increment
31:    } // end read_unlock
32:
33:    //Writer functions
34:    int write_lock(lock_t *l){
35:    //Acquire all per-CPU locks
36:        for (int i = 0; i < l→num_cpus; i++) {
37:        while (l→per_cpu_locks[i] != 0 || !CAS(&l→per_cpu_locks[i],0,
38:            tld_id)){
39:            CPU_PAUSE( );
40:        } // end while
41:        } // end for
42:        // turn the blocking indicator/flag on, blocking additional incoming readers
43:        FAA(&l→global_lock, BLOCK_READERS);
44:        // wait for existing readers to finish
45:        while (l→global_lock != BLOCK_READERS) CPU_PAUSE( );
46:        return 0;
47:    } // end write lock
48:    void write_unlock(lock_t *l) {
49:        l→global_lock = 0;
```

```
50:         for (int i = 0; i < l→num_cpus; i++) {
51:             l→per_cpu_locks[i] = 0;
52:         } // end for
53:     } //end write_unlock
----End EPS1 ----------------------------------
```

The read_lock function of EPS1 corresponds to the operations that a reader 125 may perform before implementing a read critical section (e.g., a set of one or more read operations that have to be protected from concurrent writers) on a particular shared data object (SDO) 130 in some embodiments. The read_unlock function corresponds to the operations that a reader 125 may perform after completing a read critical section. Similarly, the write_lock function of EPS1 corresponds to operations that a writer 126 may perform before implementing a write critical section (e.g., a set of one or more write operations that have to be protected from other data accessors) in some embodiments, and the write_unlock function of EPS1 corresponds to operations that a writer may perform after a write critical section is completed.

In embodiments in which logic similar to that represented by EPS1 is used to implement the GSP algorithm, a given reader 125 running on a particular CPU and intending to read a particular SDO 130 may first attempt to acquire the per_cpu_lock element corresponding to the particular CPU on which the reader is running (lines 12-14 of EPS1). In some implementations, the non-global-locks may for example be spin locks. More generally, the reader 125 may first attempt to acquire a selected non-global lock from collection NGLC 134 of the SGLM 132 corresponding to the to-be-read SDO 130 in various embodiments. If the attempt succeeds, the read_lock function may return a success indicator (the return value of zero in line 14 denotes success), and the reader may proceed to implement the read operations of its reader critical section.

It may, however, be the case that the reader 125 is unable to acquire the selected non-global lock or per_cpu_lock. In EPS1, this may occur if some other thread already holds/owns the lock (checked on line 13) and/or if the CAS to indicate that the reader has successfully acquired the per_cpu_lock (line 14) fails. The non-global lock may, for example, be owned currently by a different reader, or by a writer. In EPS1, the identity of the owner of a non-global lock (per_cpu_lock) is indicated by a thread identifier stored in the non-global lock, and if a reader holds/owns the per_cpu_lock, it must have been running on the same CPU as the reader executing read_lock. If the reader is unable to acquire the selected non-global lock from collection NGLC 134, the reader may attempt to use an alternate or secondary pathway to gaining read access to the SDO using the global lock 135 in various embodiments. The reader may, in the embodiment depicted in FIG. 1, first examine/check a blocking indicator associated with the global lock. In EPS1, the blocking indicator (BLOCK_READERS) is stored in the least significant bit (LSB) of the global lock itself, with an LSB value of 1 indicating that readers are blocked from using the global lock, and an LSB value of 0 indicating that readers are free to use the global lock. Other approaches towards implementing blocking indicators may be used in different embodiments. Line 17 of EPS1 corresponds to checking the blocking indicator by the reader. If readers are prevented from proceeding to use the global lock 135 by the blocking indicator, the reader may give up the CPU (line 18 of EPS1) and return to attempting to lock the non-global lock.

If the blocking indicator allows readers to make progress, in at least in some embodiments the reader 125 may proceed to use the global lock to acquire access to the targeted SDO, without having acquired the non-global lock that it attempted to (and failed to) acquire earlier in at least some embodiments. The specific manner in which the global lock is employed, and/or the specific modification made or caused by the reader to indicate that the read access has been obtained, may differ in different embodiments. In embodiments in which logic similar to that shown in EPS1 is used, a counter of readers, represented within the global lock, may be incremented to indicate that the reader has obtained read access, e.g., using a CAS operation similar to that of line 22. The (+2) parameter of the CAS of line 22 is used for incrementing because the LSB is already used for the blocking indicator, sousing (+1) would be incorrect. If the CAS succeeds, read_lock returns success, otherwise the CPU is given up by the reader, and the reader again starts read_lock operations by attempting to acquire the selected non-global lock. In effect, the incrementing of the counter of the global lock may represent the logical equivalent of the acquisition of a (slow path) read lock on the corresponding shared data object in some embodiments, using an alternative to the (fast path) non-global locks. Multiple readers (which may be running at any of the CPUs or processing elements of the computing environment) may concurrently read the targeted SDO as long as the blocking indicator does not prevent readers from using the slow path, e.g., after performing respective increments of the counter in various embodiments. In one embodiment, for example, after a first reader uses the slow path or global lock to obtain read access to an SDO, and before the first reader completes its read operations, a second reader may also use the slow path to concurrently obtain read access to the SDO and start its own read operations on the SDO. In embodiments in which counters similar to those of EPS1 are used, the theoretical maximum number of concurrent readers may, for example, be limited only by the largest integer that can be expressed using the counters. In some embodiments in which the accessors are running in a computing environment in which the number of non-global locks is set equal to the number of processing elements (e.g., CPUs) available for the accessors, and each reader first attempts to acquire the non-global lock corresponding to the processing element on which that reader is running, the slow secondary path offered by the GSP algorithm may have the additional advantage that readers may be able to make progress on their reads even in oversubscription scenarios (scenarios when the total number of readers exceeds the total number of processing elements).

After a reader 125 has completed its critical section operations, read_unlock may be called in embodiments in which logic similar to EPS1 is used. The reader may then in effect undo the locking-related operations it performed earlier to obtain read access to indicate that it is now relinquishing read access, after determining whether it used the non-global lock or the global lock. If it had used the non-global lock (as checked in line 28 of EPS1), it may release that lock (e.g., by resetting the non-global lock to zero on line 29) in various embodiments; if it had used the global lock, it may for example decrement the counter that was incremented earlier (line 30) in some embodiments. Thus, in at least some embodiments, the incrementing of the counter may indicate an acquisition of read access by some reader, or an indication that read access has been obtained and a read critical section may therefore be in progress, while the decrementing of the counter may indicate that read access has been relinquished and is no longer required by some reader. Note that although such a counter may indicate the number of (at least potentially) active readers, the identity of the specific readers that have acquired read access using the global lock need not necessarily be stored/retained in at least some embodiments. Note also that in embodiments in which the reader stores its thread identifier in the non-global lock to indicate ownership of the lock (as in EPS1), the reader may be able to determine whether it used the non-global lock by comparing the contents of the non-global lock to its thread identifier. In at least one embodiment in which no two threads are allowed to run on the same CPU or processing element, and one non-global lock is used per processing element for a given SDO, respective values representing readers or writers (e.g., "1" for a writer and "2" for a reader) may be stored to indicate non-global lock ownership, instead of using unique thread identifiers.

When a writer 126 intends to perform a write operation on an SDO 130 in the embodiment depicted in FIG. 1, the writer may first acquire the non-global locks (NGLC 134) (corresponding to lines 36-41 of the write_lock function of EPS1) associated with that SDO, e.g., to prevent any readers from using the NGLC to gain read access while the writer applies its writes to the SDO. Note that in some embodiments, not all the non-global locks may have to be acquired by the writer. After acquiring the non-global locks, the writer may set the blocking indicator to prevent any additional readers from acquiring read access to the SDO using the global lock 135 (line 43 of EPS1) in various embodiments. In some embodiments an atomic fetch-and-add (FAA) or similar atomic update operation may be used to modify the blocking indicator efficiently, e.g., without acquiring a lock, because only the current writer (which holds the NGLC locks) may attempt such a modification. In other embodiments, instead of using a single bit for the blocking indicator, one or more bytes may be used for the blocking indicator. It may be the case that some readers that acquired read access via the global lock are still performing their read critical sections, and the writer may have to wait for such readers (if any) to complete their reads in various embodiments. In ESP1, this waiting corresponds to line 45 (each reader decrements the counter, until the counter eventually becomes zero and the only non-zero bit of the global lock is the blocking indicator LSB; meanwhile, the writer repeatedly reads the counter and waits for it to become zero). After all the readers have completed their critical sections and in effect released their read locks on the global lock, write_lock returns success in embodiments employing logic similar to EPS1. The writer may at this stage perform the write operations of its critical section, and then call the equivalent of write_unlock of EPS1, resetting the blocking indicator and releasing the non-global locks in various embodiments. Note that resetting the blocking indicator in write_unlock may not require an atomic operation in embodiments in which logic similar to that of EPS1 is used. When the writer enters its critical section in such embodiments, the value of the global lock is equal to BLOCK_READERS (as ensured in operations corresponding to line 45 of EPS1), and this value does not change while the writer is in the critical section. Therefore, it is safe to reset the blocking indicator non-atomically (line 49 of EPS1).

In at least some embodiments, as indicated above, the use of the non-global locks may represent a fast path to obtain read access, while the ability to use the global lock may represent a potentially slower alternate path. For example, in an embodiment in which each processing element (e.g., CPU or NUMA node) of the computing environment has a respective fast local cache, individual ones of the non-global locks (e.g., per-CPU locks as in EPS1) may be retained within the respective caches, so acquiring/releasing the non-global locks corresponding to the reader's processing element may not result in cache coherence traffic and may therefore be faster than if cache coherence traffic were to occur. Note that, while reading/writing to the global lock may incur some coherence traffic in such embodiments and thus may be slower than corresponding operations on the non-global locks, the use of the global lock may at least enable readers to make progress (unless of course the blocking indicator is set), instead of simply waiting for the non-global lock to become available. Benchmark results conducted using some embodiments indicate that the GSP approach, when compared to alternatives such as using the "brlock" construct supported in some Linux systems, show substantially higher overall throughputs (e.g., measured in read operations/second), especially in environments in which the ratio of readers to writers is high. In one test, for example, throughput when using the GSP algorithm continued to increase near-linearly until a concurrency of 72 threads for a workload comprising 99.99% readers, while the maximum throughput achieved using the best-performing alternative approach tested (brlock) was lower by a factor of approximately two to three, and did not increase beyond approximately 20-30 threads. Significant improvements relative to alternative locking approaches were also measured for workloads with lower read-to-write ratios. These types of performance improvements may occur at least partly because, in contrast to the brlock approach and other similar approaches, in an environment in which GSP is employed, a reader (when it finds its targeted non-global lock held) is not necessarily blocked until the end of the write critical section as it can still acquire read access through the secondary/slow path.

In some embodiments, a collection of non-global locks (such as the per_cpu_locks of EPS1) may be used to enhance the performance of other types of read-write locks, e.g., by in effect superimposing the fast path on top of the existing read-write lock implementation. A technique which may be used in one embodiment to enhance the performance achievable by an underlying read-write lock implementation by adding the use of a collection of non-global-locks is illustrated in example pseudo-code EPS2 below. The underlying read-write lock (rwlock) supports the lock_read_acquire( ) and lock_write_acquire( ) calls to obtain a lock in read mode and write mode respectively. As in EPS1, a reader in EPS2 first attempts to acquire a non-global-lock (per_cpu_lock) to gain read access (lines 3 and 4). If the reader fails to acquire the non-global-lock, it falls back to acquiring the read-write lock in read mode (line 5). The use of the non-global lock may (as in EPS1) represent a fast path to acquire read access, and the use of the read-write lock may be considered the slow alternative path in EPS2. As in EPS1, a write in EPS2 begins by acquiring the non-global locks, and subsequently acquires the read-write lock in write mode (line 17). The read_unlock and write_unlock functions corresponding to EPS2 are straightforward (as are the declarations of the locking-related data structures) and are not shown. In effect, in embodiments in which an approach similar to that of EPS2 is taken, the SGLMs 132 of FIG. 1 may incorporate an existing type of read-write lock instead of the global lock 135, and the existing types of lock acquisition/release functions of the read-write locks may be used for the slow path, while the NGLCs 134 may continue to be used for the fast path.

```
-----EPS2: Example pseudo-code set 2 for improved RW lock using
GSP-------
    1:        int read_lock(lock_t *l) {
    2:            // try to acquire the per-CPU lock first
    3:            if ( l→per_cpu_locks[tld_cpu] == 0 &&
    4:                CAS(&l→per_cpu_locks[tld_cpu],0,tld_id)) return
                        0;
    5:            lock_read_acquire (&rwlock);
    6:            return 0;
    7:        } // end read_lock
    8:
    9:        int write_lock(lock_t *l) {
    10:           // acquire all per-CPU locks
    11:           for (int i = 0; i < l→num_cpus; i++){
    12:               while (l→per_cpu_locks[i] != 0 ||
    13:                   !CAS(&l→per_cpu_locks[i],0,tld_id)){
    14:                   CPU_PAUSE( );
    15:               } // end while
    16:           } // end for
    17:           lock_write_acquire(&rwlock);
    18:           return 0;
    19:       } // end write_lock
----End EPS2 ----------------------------------
```

Figure 2:
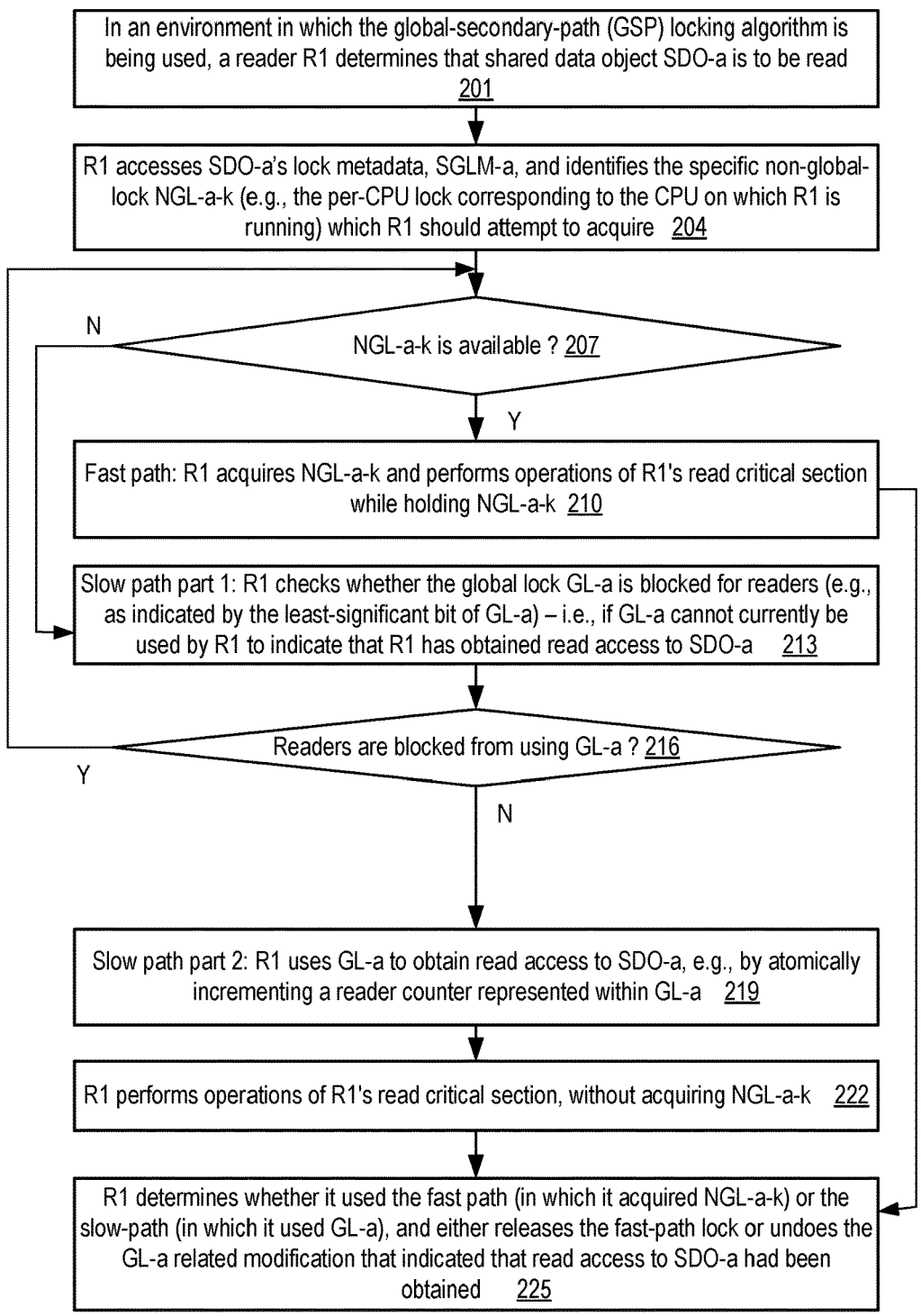
FIG. 2 is a flow diagram illustrating aspects of operations which may be performed by a reader of a shared data object in an environment in which a global secondary path algorithm is implemented, according to at least some embodiments.

FIG. 2 is a flow diagram illustrating aspects of operations which may be performed by a reader of a shared data object in an environment in which a global secondary path algorithm is implemented, according to at least some embodiments. A reader R1 may determine that a shared data object SDO-a is to be read (block 201 of FIG. 2) in a computing environment in which a GSP algorithm similar to that discussed in the context of FIG. 1 and EPS1 is implemented. As discussed in the context of FIG. 1, a set of locking-related metadata (SGLM) comprising a collection of non-global locks as well as a global lock may be maintained for individual ones of the shared data objects in various embodiments. R1 may access SDO-a's lock metadata, SGLM-a, and identify, from among the collection of locks in SGLM-a, the specific non-global lock NGL-a-k that is to be acquired by R1 (block 204) in the depicted embodiment. Note that in embodiments in which one non-global lock is maintained per CPU or core, and the data accessors are threads, the identification of the lock may be trivial—the reader thread may simply select the non-global lock corresponding to the CPU or core currently being used by the reader. In other embodiments other approaches (such as applying a mapping function to a reader's identifier) may be used to select the non-global lock NGL-a-k.

If NGL-a-k is available (i.e., if it is not held/owned by some other thread, which may be determined using a variety of approaches depending on the NGL implementation being used), as detected in block 207, R1 may be able to use a fast path for reads (block 210) in the depicted embodiment. In the fast path, R1 may acquires NGL-a-k and perform operations of R1's read critical section while holding NGL-a-k. After the critical section operations are completed, R1 may free up NGL-a-k (e.g., after verifying that R1 had used the fast path and is still the owner of NGL-a-k) in various embodiments (block 228). In at least some embodiments, an identifier of the NGL owner may be stored within a word or other data structure being used for an NGL, so determining whether the fast path was used may comprise simply comparing the contents of the NGL with the reader's identifier (e.g., a thread identifier). In other embodiments, other approaches may be used—e.g., if no more than one reader and no more than one writer runs on a given CPU and a per-CPU lock array is being used for the NGLs, a small integer may be used to encode whether a reader or writer is holding the per-CPU NGL.

If NGL-a-k is not available, because it is held/owned by some other reader or by a writer (as also detected in operations corresponding to block 207), R1 may initiate the slow path for reads in the depicted embodiment. R1 may, for example, check whether read access using the global lock GL-a associated with SDO-a is currently blocked (block 213). In some implementations, the indication as to whether readers are blocked or not may be stored in a single bit (such as the least significant bit or LSB of the global lock GL-a itself). In other implementations, a different technique may be used to indicate whether readers are blocked or not. In at least some embodiments, the contents of the global lock GL-a (e.g., a counter indicating the current number of concurrent readers using the slow path) may be changed by a reader to indicate read access, so if read access via GL-a is blocked, R1 may not be permitted to modify GL-a.

If additional readers (such as R1, as opposed to readers that have already obtained read access to SDO-a via GL-a) are blocked, as determined in operations corresponding to block 216, R1 may in some embodiments pause its operations for a short period and go back to trying to acquire NGL-a-k (block 207). In other embodiments, R1 may wait, at least for a brief period, to determine whether GL-a is no longer blocked for readers; if blocking is no longer in effect after such a wait, the reader may continue with operations corresponding to block 219. In implementations in which blocking the reader constitutes storing a value in a portion of GL-a (such as the LSB, or a byte at a particular offset) by a writer, R1 may examine that portion of GL-a to determine the status of the blocking condition (e.g., whether the LSB or byte is set or cleared).

If additional readers were not blocked from using GL-a (as also detected in operations corresponding to block 216), R1 may use GL-a to obtain read access to SDO-a in the depicted embodiment (block 219). As discussed earlier, in some implementations, an indication that R1 has read access to SDO-a may be provided by incrementing a counter of slow-path readers which is incorporated within GL-a. R1 may then perform operations of its critical section, without having to acquire NGL-a-k in the depicted embodiment (block 222). After the critical section is complete, R1 may determine which of the two paths it used (the fast path via acquisition of NGL-a-k, or the slow path via GL-a), and undo the corresponding changes (block 225) in the depicted embodiment—e.g., by releasing NGL-a-k if it had acquired NGL-a-k, and by decrementing a counter within GL-a if it had earlier incremented the counter. A similar flow of operations as that shown in FIG. 2 may be performed by various readers for other read operations directed to various shared data objects in embodiments in which the GSP algorithm is employed.

Figure 3:
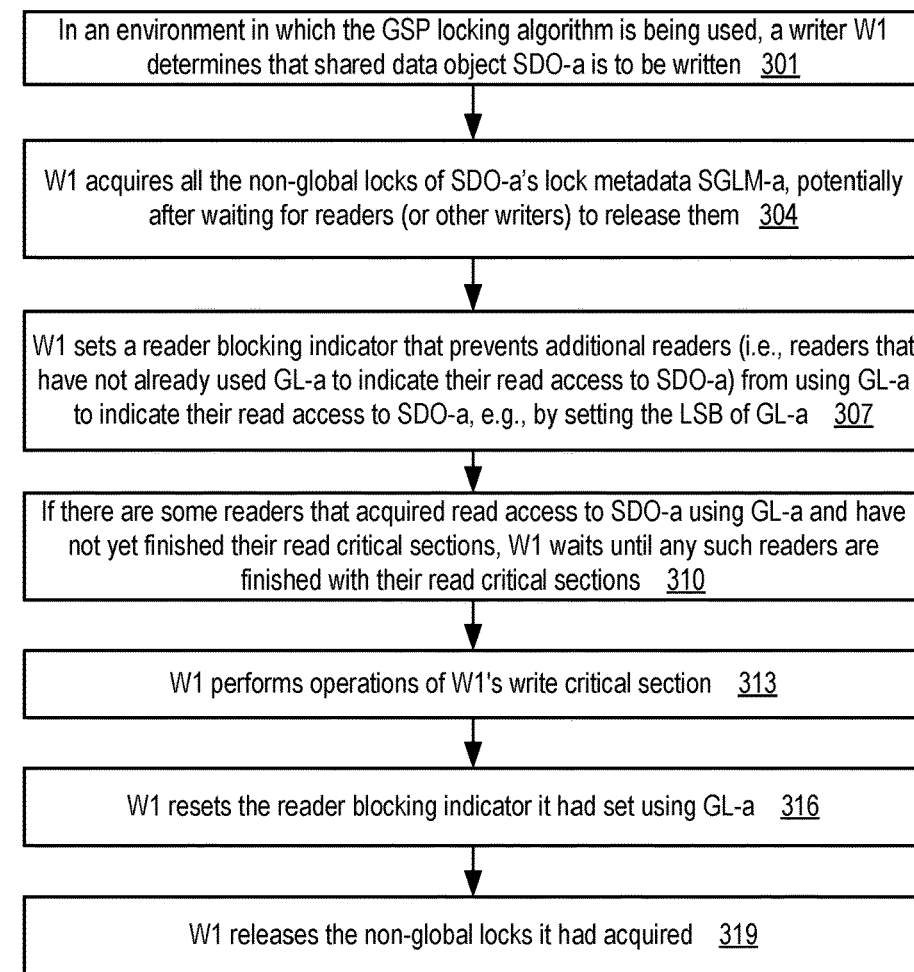
FIG. 3 is a flow diagram illustrating aspects of operations which may be performed by a writer of a shared data object in an environment in which a global secondary path algorithm is implemented, according to at least some embodiments.

FIG. 3 is a flow diagram illustrating aspects of operations which may be performed by a writer of a shared data object in an environment in which a global secondary path algorithm is implemented, according to at least some embodiments. A writer W1 may determine that a shared data object SDO-a is to be written in a computing environment within which a GSP algorithm similar to that discussed in the context of FIG. 1 is in use (block 301). Before it can perform the writes of its critical section, W1 may have to ensure that no other writers are writing to SDO-a, and also that no readers are reading from SDO-a (using either the fast path or the slow path) in the depicted embodiment. As such, W1 may first acquire all the non-global locks (NGLs) associated with SDO-a, potentially after waiting for readers (or other writers) to release them (block 304). This may, for example, help ensure that no fast path readers (or other writers) are able to access SDO-a via the NGLC during W1's write critical section.

W1 may then set a reader blocking indicator to prevent any additional readers from using the slow path to access SDO-a in the depicted embodiment (block 307). Note that W1 may not be able to prevent readers that have already obtained access via GL-a from continuing with their read critical sections in at least some embodiments. In at least some implementations, the blocking indicator may be part of GL-a itself, e.g., the LSB of a 64-bit word being representing GL-a may be used as the blocking indicator, or some other part of GL-a may be used. In other implementations, the blocking indicator (and/or the indicator that readers are accessing SDO-a using GL-a) may not be part of GL-a itself.

If there are some slow path readers whose read critical sections are (or may potentially be) underway, or slow path readers who have already used GL-a to indicate that they are going to begin their read critical sections, W1 may wait for the readers to finish their read critical sections and indicate (e.g., by decrementing a slow-path reader counter of the kind discussed above all the way to zero) that they are finished (block 310) in various embodiments. Having obtained the NGLs (assuring that there are no fast path readers active) and waited for any readers that were using the slow path to finish reading SDO-a, W1 may initiate its own write critical section (block 313) in the depicted embodiment.

After its write operations are completed, W1 may reset the blocking indicator it had set previously, enabling new readers to again start using the slow path (block 316) in the depicted embodiment. W1 may also release the NGLs it had acquired (block 319), enabling readers to obtain the NGLs to also/instead perform fast path reads in various embodiments.

FIG. 4 illustrates example contents of global and non-global locks which may be employed in a global secondary path algorithm, according to at least some embodiments. In some embodiments, for example, a global lock (GL) 435 used to manage access to a given shared data object using a GSP algorithm of the kind discussed earlier may comprise N1 bits (e.g., 64 bits or 128 bits), of which one bit (such as the least significant bit 440) may be used as a reader blocking indicator. An LSB value of 1 may, for example, be set to indicate that readers are blocked in one implementation, while an LSB value of 0 may indicate that readers are not blocked. In other implementations, 1 may indicate that readers are not blocked, while 0 may indicate that readers are blocked. Within the remaining portion 442 of the global lock, a counter may be used to indicate the number of readers that are currently accessing (or have permission, obtained via the GL, to access) the corresponding shared data object. Other arrangements may be used in some embodiments—e.g., instead of using the LSB, some other bit or set of bits/bytes may be used as the blocking indicator, a counter of readers may be stored separately from the GL, and so on. In some implementations, atomic modification operations (such as a compare-and-swap (CAS) primitive supported by the underlying architecture being used at the computing environment in which the GSP algorithm is being implemented) may be use to modify the contents of the GL, such as a reader counter in portion 442 and/or the blocking indicator. In at least one implementation, an atomic fetch-and-add (FAA) operation or similar atomic modification operation may be used to set/rest the blocking indicator. In at least some embodiments in which only a writer is permitted to modify the blocking indicator, and a workflow similar to that shown in FIG. 3 is used, the writer may not need to use any locks or other synchronization mechanisms to update the blocking indicator, as it may already be holding all the NGLs associated with the shared data object when it is reaches the stage of modifying the blocking indicator (and therefore may be guaranteed that no other writer could be attempting to modify the blocking indicator).

A non-global lock (NGL) 470 may comprise N2 (e.g., 64 or 128) bits in the depicted embodiment. In some embodiments, N2 may be selected based at least in part on a cache line size of a processing element such as a CPU or NUMA node, such that accessing/modifying a given NGL 470 does not require accessing/modifying more than one cache line. In at least some embodiments, an NGL 470 may be used to store an identifier of its owner, such as the thread identifier of the reader or writer which has acquired the NGL. In at least some embodiments, an atomic modification operation such as a CAS primitive may be used to modify the contents of an NGL 470.

Figure 5:
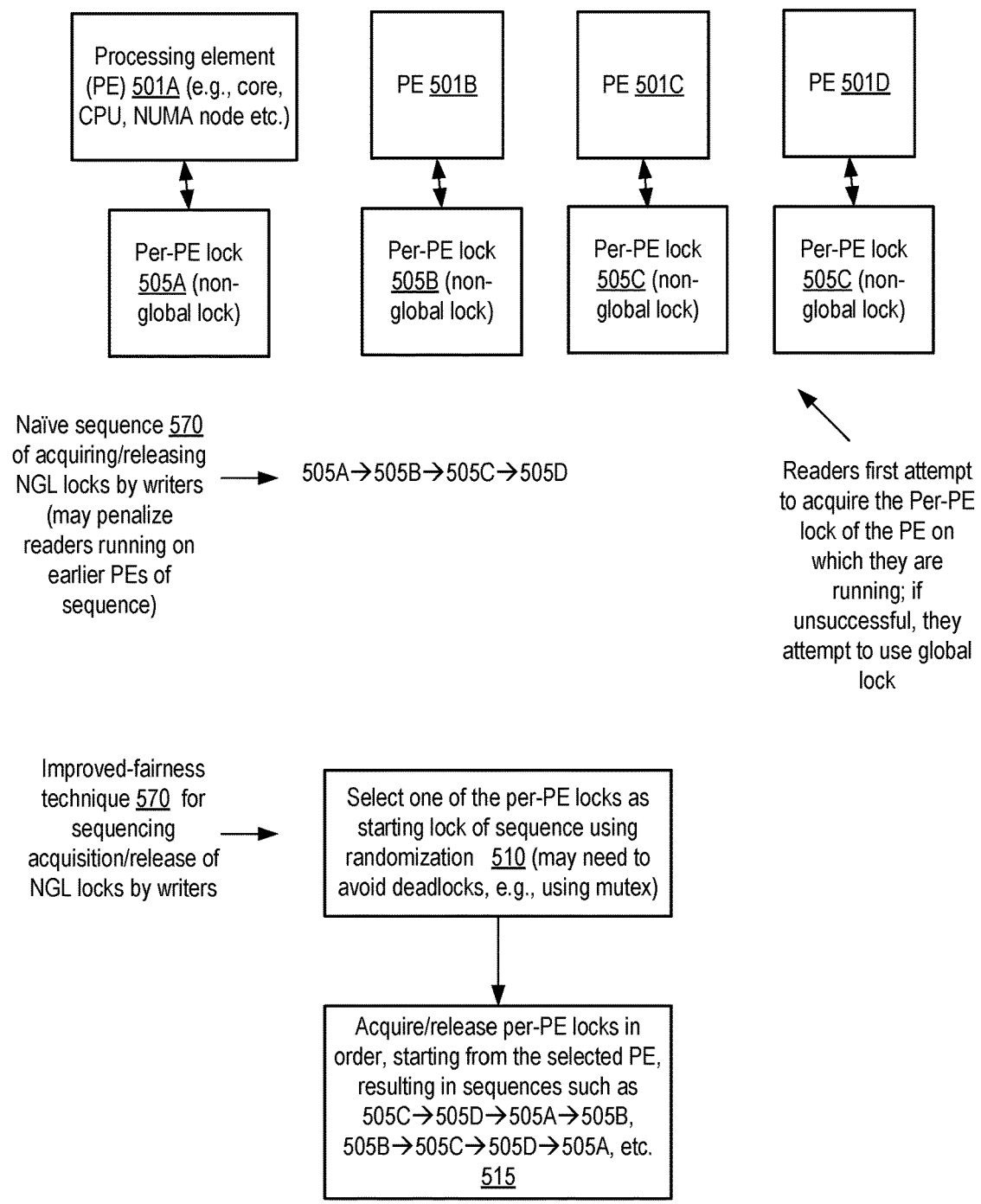
FIG. 5 illustrates example aspects of an improved-fairness technique which may be employed in conjunction with a global secondary path algorithm, according to at least some embodiments.

As discussed above, a writer may acquire all the non-global-locks (such as the per-CPU locks discussed earlier) associated with a given shared data object, and the order in which the NGLs are acquired may play a role in determining which readers tend to get prevented from making progress more often than others. FIG. 5 illustrates example aspects of an improved-fairness technique which may be employed in conjunction with a global secondary path algorithm, according to at least some embodiments. In the depicted example scenario, a computing environment comprises four processing elements (e.g., CPUs, cores, NUMA nodes, etc.), PEs 501A-501D, and the collection of NGLs for a given shared data object includes one lock 505 per PE. As part of its workflow, an individual reader running on a particular PE may first be required to attempt to acquire the per-PE lock 505C of that particular PE in the depicted embodiment; if the attempt fails, the reader may resort to the slow path portion of the GSP algorithm, in which the global lock associated with the shared data object may be accessed and/or modified as discussed earlier.

In a naïve approach 570, writers of the shared data object may always start by acquiring per-PE lock 505A, then acquire per-PE lock 505B, followed by 505C and finally 505D. If such an approach is used, readers running on PE 501A may (other things being equal) tend to find their target per-PE lock 505A held more frequently by writers, than readers running on PE 501B; readers running on PE 501B may similarly find their target per-PE lock 505B more likely to be owned by a writer than readers running on PE 501C, and so on. In general, readers running on PEs that are earlier in the sequence A→B→C→D may therefore tend to be worse off (forced to use the slow path more frequently) than readers running on PEs later in the sequence.

To alleviate such potential unfairness, in at least some embodiments, an improved-fairness technique 570 may be implemented for sequencing the acquisition and/or release of the NGLs by writers. In such a technique, as indicated in block 510, one of the PE locks may be selected (e.g., using a randomization technique) by a given writer as the starting lock of the sequence. The writer may then acquire (ore release) the NGLs in sequence, starting from the selected lock (block 515). Different writers (or the same writer on different write attempts) may therefore acquire/release the NGLs in different sequences—e.g., instead of always using the sequence A→B→C→D, the sequences B→C→D→A, C→D→A→B, D→A→B→C and A→B→C→D may all be used with similar frequencies. As a result, the probability that a given reader finds its per-PE lock owned/held by a writer may not vary by as much, and in as deterministic a manner, from PE to PE as in the naïve case. In some embodiments in which such an improved-fairness technique is implemented, a mutex or other synchronization technique may be used to avoid deadlocks among different writers attempting to write to the same shared data object at about the same time.

One of the potential problems encountered by some locking algorithms that utilize a per-processing-element collection of locks for each shared data object is that the size of the locking metadata may become quite large (e.g., in systems where there are numerous processing elements). Furthermore, as the size of the locking metadata is a function of the number of processing elements (such as NUMA nodes), static allocation of the lock instances may become a challenge. Some locking algorithms in which locking metadata is centralized (instead of using per-processing-element structures) may, however, be unable to support high throughputs because a "reader indicator" status may have to be updated frequently, resulting for example in cache invalidations and high levels of coherence traffic. In some embodiments, a locking technique that uses the concept of a tunable reader bias setting for fast read access in combination with a multi-element global structure to provide information about active readers may be employed at a computing environment to help alleviate such problems, e.g., instead of or in combination with the global secondary path algorithm discussed above.

Figure 6:
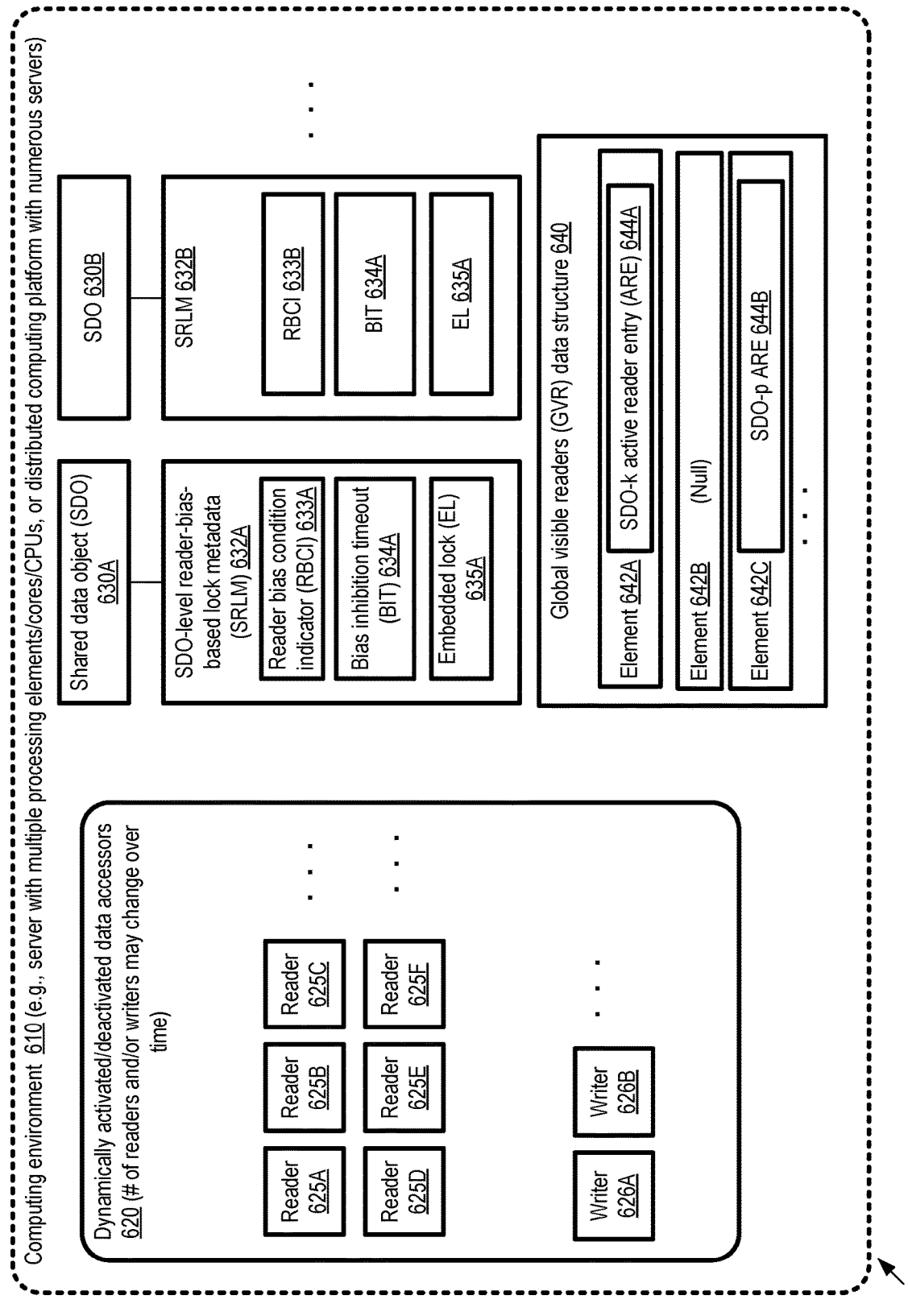
FIG. 6 illustrates an example system environment in which a reader bias based algorithm for accessing shared data objects may be implemented, according to at least some embodiments.

FIG. 6 illustrates an example system environment in which a reader bias based algorithm for accessing shared data objects may be implemented, according to at least some embodiments. Such an algorithm may be referred to as the RBB technique or algorithm in various embodiments. As shown, system 600 may comprise a computing environment 610, within which a set of data accessors 620 that may include some number of readers 625 (e.g., readers 625A-625F) and some number of writers 626 (e.g., writers 626A and 626B) may run. The computing environment may also comprise one or more shared data objects (SDOs) 630, such as SDO 630A and 630B, which may be accessed and/or modified at various points in time by the data accessors. In various embodiments, the number of readers 625 and/or writers 626 may change over time; for example, there may be intervals during which there no writes are being attempted or performed on a given SDO 630, periods during which no reads are being attempted or performed, periods in which numerous readers are attempting to concurrently or near-concurrently read from a given SDO, and so on. Data accessors may be dynamically activated and/or deactivated in at least some embodiments, e.g., by forking new threads or processes at a computing device or terminating such threads or processes. Similarly, the number of shared data objects may change over time as well. A given data accessor (such as a thread) may perform respective critical sections comprising read and/or write operations on numerous SDOs during its lifetime in the depicted embodiment, as well as other types of operations that are not part of critical sections. Thus, in such an embodiment, a data accessor may potentially change its role from a reader to a writer (and/or from a writer to a reader) as it progresses.

The computing environment 610 may comprise a single server or computing device in some embodiments (e.g., with one or more processing elements such as cores or CPUs), and multiple servers/computing devices in other embodiments. In at least some embodiments, the computing environment within which the data accessors 620 run and/or the shared data objects and associated metadata are stored may include one or more servers implementing a NUMA architecture. Individual ones of the SDOs 630 may be defined at any desired granularity in different embodiments.

In the depicted embodiment, a respective set of locking-related metadata 632, used in the RBB algorithm, may be stored corresponding to individual ones of the SDOs—e.g., metadata 632A may be associated with SDO 630A, metadata 632B may be associated with SDO 630B, and so on. The locking metadata 632 associated with a given SDO may be referred to as the SDO-level reader-bias-based lock metadata (SRLM) for that SDO in the depicted embodiment. SRLM 632 for a given SDO 630 may comprise, for example, an embedded lock (EL) 635 (e.g., 635A or 635B), a reader bias condition indicator (RBCI) 633 (e.g., 633A or 633B), and a bias inhibition timeout indicator (BIT) 634 (e.g., 634A or 634B). In at least some embodiments, a given RBCI may comprise a Boolean flag. In addition, a global visible readers data structure (GVR) 640 may be maintained in the depicted embodiment, used to provide indications of active readers to writers as discussed below. GVR 640 may comprise a plurality of entries, slots or elements 642 (e.g., 642A, 642B or 642C) in various embodiments. In the example scenario depicted in FIG. 6, element 642B is empty (null), element 642A contains an active reader entry (ARE) 644A which indicates that a particular SDO (SDO-k) is being read, and element 642C contains an ARE 644B indicating that another SDO-p is being read. As such, in at least some embodiments, a GVR 640 may store information about active readers of a plurality of data objects. In at least some implementations, the amount of memory used for the global data structure may not necessarily be dependent on the number of data accessors or the number of shared data objects to which access is being managed.

Example pseudo-code set 3 (EPS3) shown below indicates, at a high level, one approach towards implementing the RBB algorithm which may be employed in some embodiments. A Python-style syntax is used in EPS3 by way of example; any appropriate programming language may be employed in various embodiments. Using the RBB technique, in various embodiments existing reader-writer lock designs (e.g., the designs used for embedded locks 635) may in effect be augmented, adding a few small fields (e.g., the RBCIs 633 and the BITs 634) to the lock metadata for a given shared data object, thus keeping the impact on memory footprint small relative to the memory footprint associated with the existing lock designs. In EPS3, the RBBLock data structure corresponds to the SRLM 632 of FIG. 6 for a given SDO 630, with RBias corresponding to an RBCI 633, InhibitUntil corresponding to a BIT 634, and T corresponding to an EL 635. The VisibleReaders array shown on line 7 of ESP3 corresponds to one example implementation of the GRV 640 of FIG. 6. The Reader( ) function starting on line 11 of ESP3 indicates an example flow of operations performed by reader 625 (with the critical section represented by the ReaderCriticalSection( ) function of line 28). The Writer( ) function starting at line 35 shows example operations that may be performed by writers 635 in at least some embodiments (with the critical section represented by the WriterCriticalSection( ) function of line 49).

```
-----EPS3: Example pseudo-code set 3 for Reader-Bias-Based (RBB) algorithm -------
1:         class RBBLock<T> :
2:            int RBias
3:            Time InhibitUntil       # timeout after which reader biasing can be enabled
4:            T Underlying            # underlying/embedded lock
5:
6:            ## Shared global visible readers table
7:            RWLock * VisibleReaders [1024]
8:            int N = 9   # slow-down guard
9:
10:           def Reader(RBBLock *L) :
11:             RBBLock * slot = null
12:             if L.RBias :
13:               slot = VisibleReaders + Hash(L, Self)
14:               if CAS(slot, null, L) == null:
15:                 #CAS succeeded
16:                 #store-load fence required on TSO
17:                 #typically subsumed by CAS
18:                 if L.RBias :                           # recheck bias
19:                              goto EnterCS              # fast path
20:                 *slot = null
21:               slot = null
22:             # Slow path
23:             assert slot == null
24:             AcquireRead (L.underlying)
25:             if L.RBias == 0 and Time( ) >= L.InhibitUntil :
26:               L.RBias = 1
27:           EnterCS:
28:             ReaderCriticalSection( )
29:             if slot != null :
30:               assert *slot == L
31:               *slot = null
32:             else :
33:               ReleaseRead (L.Underlying)
34:
35:           def Writer(RBBLock * L)
36:             AcquireWrite (L.underlying)
37:             # store-load fence required on TSO
38:             if L.RBias:
39:               # revoke bias
40:               L.RBias = 0
41:               auto start = Time( )
42:               for i in xrange(VisibleReaders):
43:                 while VisibleReaders[i] == L :
44:                              Pause( )
45:               auto now = Time( )
46:               # limit and bound slow-down
47:               # arising from revocation overheads
48:               L.InhibitUntil = now + ((now – start) * N)
49:             WriterCriticalSection( )
50:             ReleaseWrite (L.Underlying)
----End EPS3 ---------------------------------
```

Upon determining that a particular SDO 630 is to be read, a reader 625 may examine the corresponding RBCI 633 (L.RBias in EPS3) in various embodiments. If the RBCI 633 is set to a particular value (a "reader bias enabled" value, such as a non-zero value checked in line 12 of EPS3), in various embodiments a reader 625 may simply store an entry (an ARE 644) into a selected element of GVR 640, and proceed to its read critical section without acquiring the EL 635 associated with the shared data object. In EPS3, the reader selects a particular slot of the VisibleReaders array using a hash function (line 13), and then attempts to store the RBBLock's identifier (L) within that slot using an atomic compare-and-swap operation (CAS) (line 14). Thus, in an embodiment in which an approach similar to that of EPS3 is used, the identifier of the RBBLock associated with the shared data object may be used as the active reader entry; in other embodiments, other approaches may be used, such as storing the identifier of the SDO rather than the RBBLock. In some embodiments, as in EPS3, an element selection technique (such as a hashing based technique) that tends to spread the AREs widely across the GVR may be used, reducing the likelihood of cache coherence traffic associated with the GVR. The use of the GVR without acquiring the embedded lock may represent a fast path (which may, for example, require fewer computations and therefore less time than the alternative path involving the acquisition of the embedded lock) for readers 625 in the RBB algorithm in various embodiments.

If the reader succeeds in storing its ARE into the GVR, in some embodiments it may once again check that the reader bias condition indicator is set to enable the fast path (e.g., the check in line 20 of EPS3), and then perform the read operations of its critical section. In EPS3, this set of actions associated with implementing the critical section corresponds to lines 19, 27 and 28. If the RBCI has changed (e.g., due to a race condition with a writer), the reader may clear the element of the GVR that it just wrote (line 20 of EPS3), and proceed to perform the slow path discussed below.

If the reader 625 fails to store its ARE into the GVR (e.g., if that slot is already occupied, or the CAS operation of line 14 of EPS3 fails), the reader 625 may simply revert to a slow path which requires the acquisition of the underlying lock (EL 635 of FIG. 6, or L.Underlying in EPS3) in at least some embodiments. In EPS3, the slow path starts at line 22, and includes the AcquireRead( ) call to obtain the underlying/ embedded lock in read mode. After acquiring the embedded lock, the reader 625 may change the value of the RBCI in some embodiments to enable subsequent readers to use the fast path, e.g., based on a bias inhibition timeout (BIT 634) parameter (L.InhibitUntil in EPS3) which may have been set by a writer. In the example shown in EPS3, this is done (in lines 25-26) before the reader enters its critical section. In some embodiments, a reader may change the RBCI after (or during) the critical section operations. Verifying, before changing the RBCI, that the BIT has expired represents one example of a reset condition that may be checked by readers (or writers) to re-enable fast paths for readers in different embodiments. After the reader's critical section operations are complete, in various embodiments the reader may either (a) clear the element of the GVR that it used (lines 29-31 of EPS3) or (b) release the underlying/embedded lock (line 33 of EPS3), depending on whether it used the fast path or the slow path. Note that at least in some embodiments, readers may only modify the RBCI while holding the embedded lock EL, thus preventing conflicts on RBCI modification with writers.

A writer 626 that is to implement a write critical section on an SDO 630 may begin by acquiring the underlying lock (EL 635 in FIG. 6, and L.Underlying in EPS3) in write mode in various embodiments. If the RBCI 633 for the SDO 630 happens to be set to enable readers to use the fast path, the writer 626 may modify the RBCI to prevent fast path access (e.g., operations corresponding to line 40 of EPS3) for additional readers (i.e., readers that have not stored an ARE already into the GVR) in some embodiments. The writer 626 may then wait for any fast path readers that currently have access (obtained via the GVR) to the SDO to complete their read critical sections (e.g., in operations corresponding to lines 42-44 of EPS3) before performing the write critical section.

The operations of modifying the RBCI, and then waiting for fast path readers to depart and clear their entries in the GVR, may be referred to as revocation of the reader bias in some embodiments. In some embodiments, writers may use automatic hardware prefetchers, if supported by the hardware being used in the computing environment, to perform a scan of the GVR (e.g., a sequential scan). In at least one embodiment, a writer 626 may utilize SIMD instructions (if supported by the architecture being used for the computing environment) to speed up the process of examining/scanning the GVR to verify that in-process fast path readers have cleared their entries. In at least some embodiments, a writer 626 may capture one or more metrics associated with the verification that active readers have cleared their GVR elements (e.g., a metric indicating how long the writer had to wait for active readers to conclude their reads), and use such metrics to set the BIT 634 (L.InhibitUntil in EPS3). For example, in EPS3, the writer may measure the time taken for the readers to complete their reads (in lines 41 and 45), multiply that interval by a parameter (N), and use the product to set L.InhibitUntil. By setting N appropriately (e.g., based on empirical analysis), it may become possible in some embodiments to impose desired bounds on the worst-case expected slow-down for writers (e.g., to 1/(N+1), which is 10% for the example N=9 value shown in EPS3). The example technique for inhibiting fast path readers shown in EPS3 is conservative, in accordance with a "minimize harm" principle; as such, the example RBBLock implementation of EPS3 is guaranteed to never underperform the underlying lock's implementation by a significant margin on any workload, and that margin can be adjusted by choosing N appropriately. Note that while N is shown as a constant in EPS3, in at least some embodiments a tunable parameter (or a set of tunable parameters) may be used to set the BIT. Measuring the revocation period as shown in the example of EPS3 incorporates both the waiting time (while readers finish their reads) and the time taken to scan the GVR, potentially yielding a conservative over-estimate of the scan cost and resulting in a less aggressive use of reader bias.

After the bias revocation (if required) is complete, the writer may perform its write critical section (line 49 of EPS3) and release the underlying lock EL in various embodiments. Note that in at least some embodiments, revocation may only be required during transitions from reading to writing (which may be infrequent in read-mostly workloads) and when the RBICs were previously set to permit fast path reads. Writers may only be required to read the GVR structure in the embodiment depicted in FIG. 6, and may not have to modify it. Other approaches towards setting/resetting the BITs may be taken in various embodiments. In some embodiments, the values of BITs may be set by entities other than writers (e.g., by a background system process or thread), and/or parameters other than a per-SDO BIT value may be used. For example, readers may track the number of successive slow-path reads that have occurred for a given shared data object, and modify the RBCI based on such a metric. A number of potential enhancements to the basic RBBLock algorithm introduced in FIG. 6 (and illustrated via example in EPS3) are discussed below.

In effect, in various embodiments the RBBLock algorithm may provide a dual existence for active readers, with their existence reflected in either the GVR or the underlying/embedded locks. Writers may resolve read-write conflicts against fast path readers via the GVR, and against slow-path readers using the underlying reader-writer locks in such embodiments. Note that if the underlying read-write lock that is augmented using RBBLock has an inherent reader preference or a writer preference, that property will also be exhibited by RBBLock in at least some embodiments. RBBLocks may act as an accelerator layer in various embodiments, as readers may always fall back to using the underlying embedded locks. The benefits of RBBLock in some embodiments may arise at least on part due to avoiding coherence traffic on the centralized reader indicators of underlying locks, and instead relying on updates to be diffused over the GVRs. Fast-path readers may use only the GVRs, and may in effect ignore the underlying locks entirely. Performance testing indicates that, at least with respect to some embodiments, the RBB technique supports significantly higher read throughputs for workloads with a large ratio of readers to writers than the underlying embedded locking techniques and/or other alternative techniques. Compared to other techniques that rely upon large sizes of locking metadata (e.g., per-CPU, per-core, or per NUMA-node sets of metadata per data object), in various embodiments the RBB technique may be able achieve higher levels of performance with only a very small increase the memory footprint. Note that write performance, and the scalability of read-versus-write and write-versus-write behavior may depend in various embodiments on the underlying/embedded lock design. In various embodiments, while the RBBLock technique may accelerate reads, write performance may typically devolve to that of the underlying/embedded locks.

Figure 7:
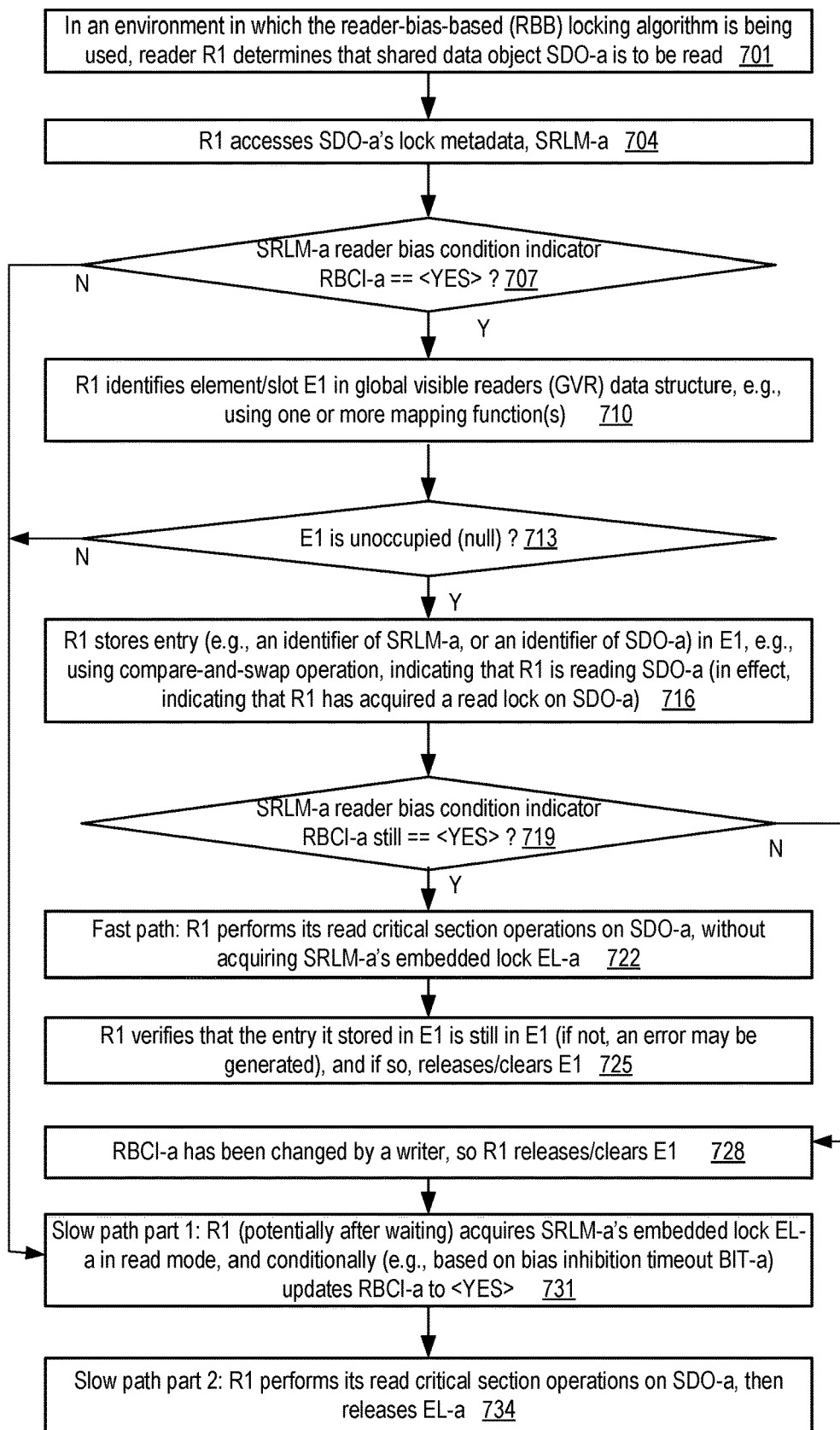
FIG. 7 is a flow diagram illustrating aspects of operations which may be performed by a reader of a shared data object in an environment in which a reader bias based algorithm is implemented, according to at least some embodiments.

FIG. 7 is a flow diagram illustrating aspects of operations which may be performed by a reader of a shared data object in an environment in which a reader bias based algorithm is implemented, according to at least some embodiments. As shown in block 701 of FIG. 7, a reader R1 may determine that a shared data object SDO-a is to be read in a computing environment in which an RBB algorithm similar to that introduced above is being used. The reader may access SDO-a's locking metadata, SRLM-a (block 704), and examine the status of a reader bias condition indicator (RBCI-a) associated with SDO-a. The setting "<YES>" for the RBCI corresponds to read bias (and therefore fast paths for readers) being enabled in the depicted embodiment.

If the setting of RBCI-a allows fast path reads, as detected in block 707 of FIG. 7, the reader R1 may identify an element or slot E1 in a global visible readers (GVR) data structure (block 710) in the depicted embodiment. One or more element selection functions or mapping functions (such as a primary hash function and, if needed, a secondary hash function applied to an identifier of the reader and/or to other parameters such as the identifier of the SDO) may be used to select the element E1 in different embodiments. If the selected element E1 is unoccupied or null (as determined in operations corresponding to block 713 of FIG. 7), R1 may store an active reader entry therein (block 716). The active reader entry may indicate that R1 has read access to, and/or is reading, SDO-a (in effect, providing the logical equivalent of a read lock) in the depicted embodiment. The specific type of content that is stored in the active reader entry may vary in different embodiments—e.g., in some embodiments, an identifier of the lock metadata SLRM-a, an identifier of the shared data object SDO-a, or some combination thereof, may be stored.

In some embodiments, the reader R1 may re-check the setting at this stage, e.g., to make sure that it has not been modified by a writer since it was last checked. If the RBCI setting remains unchanged (as detected in block 719), the reader may perform the fast-path version of its operations, including its read critical section, without acquiring the embedded lock EL-a corresponding to SDO-a in the depicted embodiment. After the read operations of R1's critical section are completed, in various embodiments R1 may verify that the active reader entry is still present in the GVR, and if so, may release or clear the GVR element into which that active reader entry was stored (element 725). Note that in some embodiments, if the active reader entry is no longer present, an error or exception may be thrown.

If, in operations corresponding to block 719, R1 discovers that the RBCI-a setting has been changed, in the depicted embodiment this may indicate that a writer has revoked the fast path since R1 read RBCI-a in operations corresponding to block 707. Accordingly, R1 may be forced to use the slow path in various embodiments, after clearing/releasing E1 (block 728). The slow path may include acquiring the embedded lock EL-a in read mode (block 731) prior to performing the read critical section and releasing EL-a (block 734) in the depicted embodiment. The slow path may also have to be used by R1 in some embodiments if RBCI-a was already set to indicate that the fast path cannot currently be used (as may be detected in operations corresponding to block 707), or if the selected element E1 of the GVR was already in use (as may be detected in operations corresponding to block 713). Operations similar to those shown in FIG. 7 may be repeated for additional reads, e.g., by R1 or other readers in various embodiments.

Figure 8:
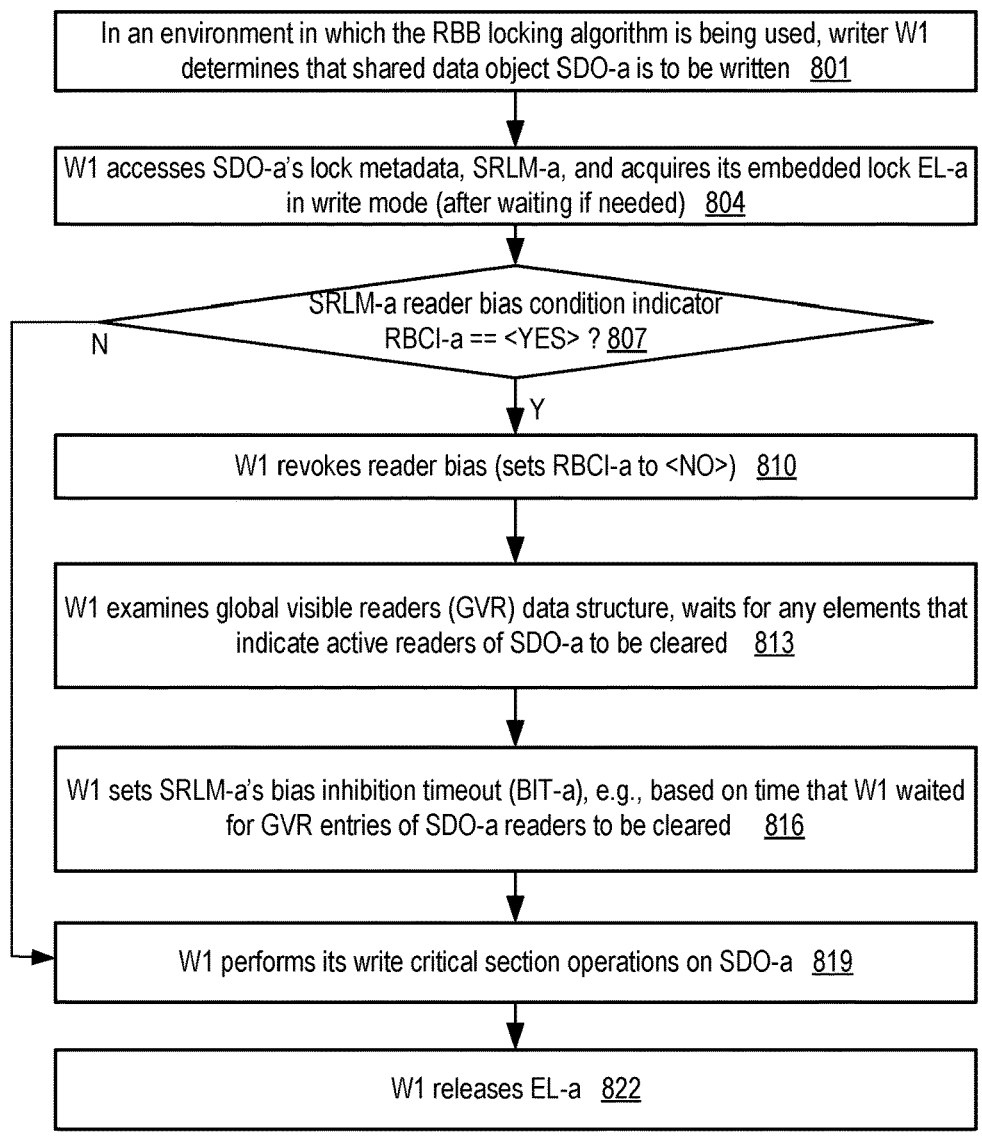
FIG. 8 is a flow diagram illustrating aspects of operations which may be performed by a writer of a shared data object in an environment in which a reader bias based algorithm is implemented, according to at least some embodiments.

FIG. 8 is a flow diagram illustrating aspects of operations which may be performed by a writer of a shared data object in an environment in which a reader bias based algorithm is implemented, according to at least some embodiments. A writer W1 may determine that a shared data object SDO-a is to be written in a computing environment in which an algorithm similar to the RBBLock algorithm introduced above is being implemented (block 801). W1 may access SDO-a's lock metadata, SRLM-a, and acquire the embedded lock EL-a associated with SDO-a (potentially after waiting for other writers or readers) in the depicted embodiment (block 804).

If the RBCI setting of SRLM-a, RBCI-a, currently allows readers to use the fast path, as detected in block 807, W1 may revoke the reader bias by modifying the setting (block 810) in various embodiments. Since W1 is already holding the EL-a lock in write mode, conflicts with other writers or readers with respect to changes applied to RBCI-a may not be possible in such embodiments. Because some fast path readers may currently be reading SDO-a, W1 may have to wait for them to finish their read critical sections in the depicted embodiment. W1 may examine the global visible readers data structure (GVR) whose elements indicate active readers, identify those GVR elements (if any) that indicate active readers of SDO-a, and wait for those readers to clear the elements (block 813) in various embodiments. In some embodiments, the GVR may be scanned (e.g., with the help of hardware prefetch operations), since W1 may not be able to predict exactly where within the GVR the active reader entries for SDO-a happen to be located. In at least one embodiment, a parallelized scan may be used, e.g., with the help of SIMD instructions if available. Hardware prefetching and/or the use of SIMD instructions may help to increase the efficiency of the GVR analysis, reducing the overhead incurred by writers in various embodiments.

In at least some embodiments, W1 may set SRLM-a's bias inhibition timeout BIT-a, e.g., based on metrics associated with the revocation operations, such as the amount of time it took W1 to scan the GVR and verify that fast path readers (if any) have completed their reads and cleared their GVR entries (block 816). W1 may then perform its write critical section operations on SDO-a (block 819) and release EL-a (block 822) in various embodiments. If, in operations corresponding to block 807, W1 determined that RBCI-a was already inhibiting fast path readers, the revocation-related operations corresponding to blocks 810-816 may not be performed in the depicted embodiment. Operations similar to those shown in FIG. 8 may be repeated for additional writes, e.g., by W1 or other writers in various embodiments.

Figure 9:
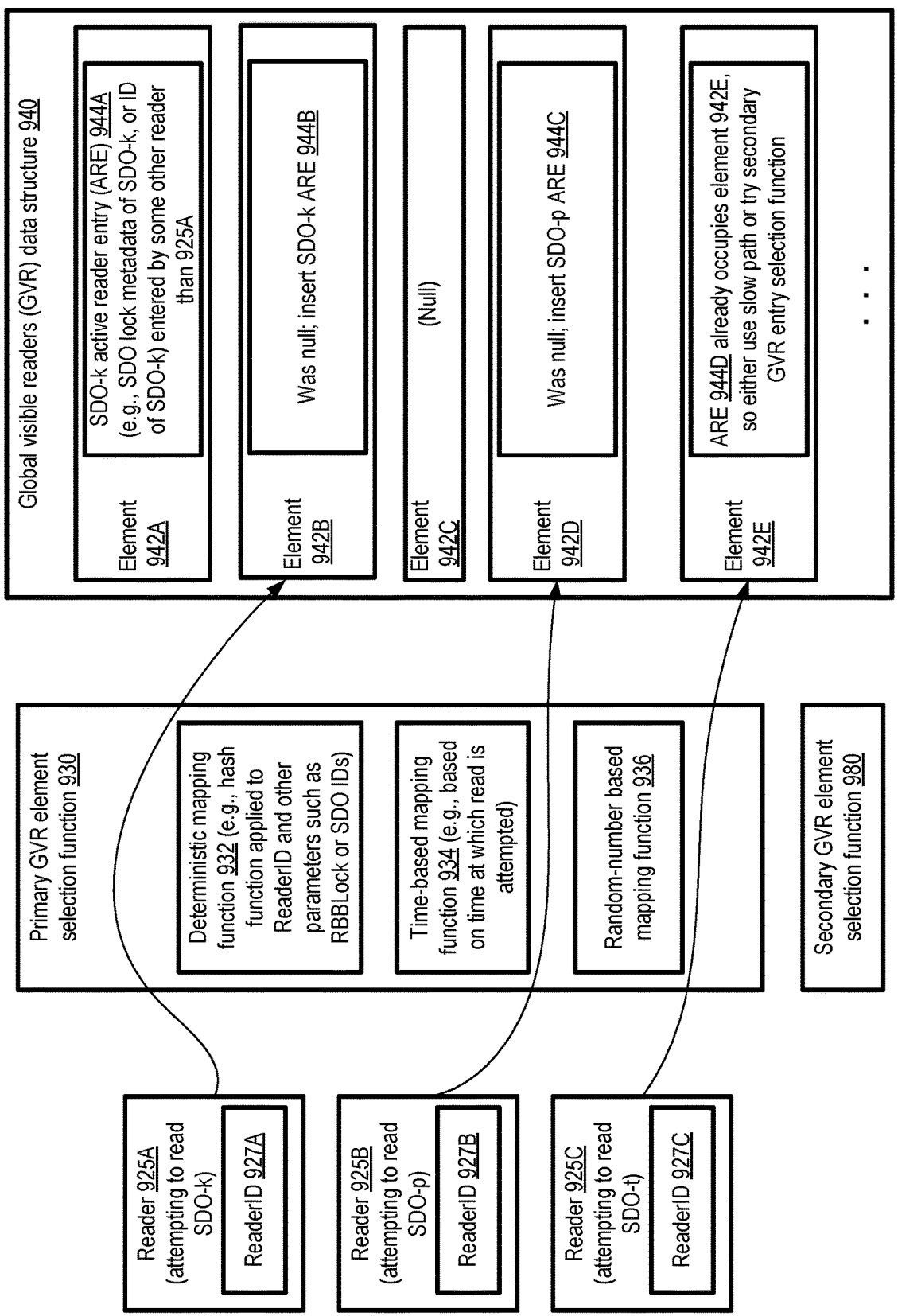
FIG. 9 illustrates examples of approaches that may be taken towards selecting entries within a global visible readers data structure by readers in an environment in which a reader bias based algorithm is employed, according to at least some embodiments.

Any of a variety of approaches may be taken towards the selection of GVR entries by readers in various embodiments. FIG. 9 illustrates examples of approaches that may be taken towards selecting entries within a global visible readers data structure by readers in an environment in which a reader bias based algorithm is employed, according to at least some embodiments. In the depicted embodiment, reader 925, with reader identifier (readerID) 927A, is attempting to read shared data object SDO-k, reader 925B with readerID 927B is attempting to read SDO-p, and reader 925C with readerID 927 is attempting to read SDO-t.

A number of different primary GVR element selection functions 930 may be used in various embodiments by the readers to select the specific slot or element within the GVR data structure 940 into which an active reader entry (ARE) is to be stored. A deterministic mapping function 932, such as a hash function (applied to the readerID of the requesting reader and other parameters such as the identifier of the targeted SDO or the corresponding RBBLock), may be used in one embodiment as the primary element selection function. In some embodiments, other properties of the reader 925 and/or the targeted SDO may be used as input to a mapping function. In another embodiment, a time-based mapping function 934, in which the element is selected based on a timestamp corresponding to the read attempt, may be used. In yet other embodiments, a random-number based mapping function 936 may be used. In some embodiments, any of several different mapping functions may be used by a given reader for a given read attempt, e.g., selected at random from a group of mapping functions. Note that at least in some embodiments, the specific element within the GVR that is used by a given fast-path reader of a given shared data object may not matter for correctness, as long as a writer is able to determine the particular SDO for which that element includes an active reader entry. In some embodiments, for the purposes of reducing cache coherence traffic, it may of course be helpful to use mapping functions that tend to widely distribute the set of elements that are used by a given reader or for a given SDO.

In the depicted example scenario, element 942A of GVR structure 940 comprises an active reader entry 944A for SDO-k, already entered by some other reader than 925A, and element 942C is empty or null. To indicate that SDO-k is being accessed, ARE 944A may include an identifier of SDO-k or an identifier of SDO-k's lock metadata SRLM-a in some embodiments. Using primary selection function 930, reader 925A selects element 942B for its ARE, finds that element 942B is empty, and inserts another SDO-k ARE 944B. Similarly, using the primary selection function, reader 925B selects element 942D, finds it unoccupied, and inserts an ARE 944C indicating that SDO-p is being read by reader 925B.

As a result of using the primary selection function 930, reader 925C of SDO-t identifies element 942E of GVR structure 940 as the target element into which its ARE should be stored. However, this element is already occupied by an ARE 944D (which may or may not represent a reader of SDO-t itself); this represents a GVR element collision. Accordingly, reader 925C may in some embodiments have to use the slow path discussed earlier, involving the acquisition of the underlying/embedded lock associated with SDO-t. In other embodiments, if the first candidate element identified using the primary GVR element selection function is occupied, a secondary GVR element selection function 980 may be used to try to find an empty candidate element. Such a secondary GVR element selection function may include other deterministic, time-based and/or random number based functions in various embodiments. In some embodiments, more than two element selection functions may be used in sequence in an attempt to find an empty or unoccupied candidate element, with the slow path eventually being used if none of the functions used results in identifying an empty element. As shown in the example scenario depicted in FIG. 9, in at least some embodiments the GVR data structure 940 may include multiple elements indicating respective active fast path readers of a given SDO (e.g., elements 942A and 942B, indicating readers of SDO-k), as well as respective sets of elements indicating active fast path readers of different SDOs (e.g., SDO-k, SDO-p, etc.).

Figure 10:
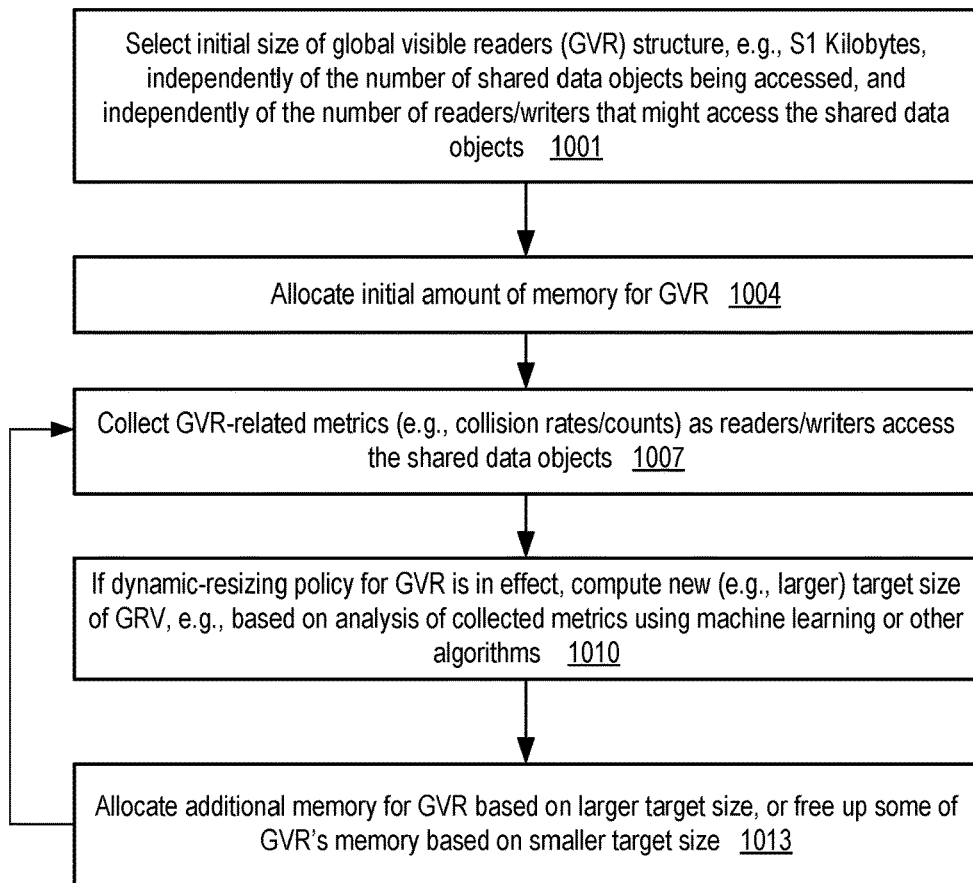
FIG. 10 is a flow diagram illustrating aspects of operations which may be performed to dynamically resize a readers data structure in an environment in which a reader bias based algorithm is implemented, according to at least some embodiments.

In at least some embodiments, the size of the global visible readers (GVR) data structure may be selected independently of the number of data accessors expected to be active, and/or independently of the number of shared data objects (SDOs) whose accesses are to be managed. In one embodiment, a fixed-size GVR may be used (i.e., the size of the GVR may not be modified for the lifetime of the application(s) comprising the data accessors); in other embodiments, the GVR may be resized under some conditions. FIG. 10 is a flow diagram illustrating aspects of operations which may be performed to dynamically resize a readers data structure in an environment in which a reader bias based algorithm is implemented, according to at least some embodiments. As shown in block 1001, an initial size (e.g., Si kilobytes) of the GVR may be selected in the depicted embodiment, e.g., independently of the number of readers/writers and the number of SDOs. The corresponding amount of memory may then be allocated for the GRV (block 1004).

A number of metrics pertaining to the GVR may be collected in various embodiments as readers and writers access the SDOs (block 1007), such as the rates at which collisions (e.g., scenarios in which the fast path is enabled for readers, but readers find their targeted GVR element occupied and so are forced to use the flow path or use additional element selection functions) occur, and/or the absolute counts of collisions. If a dynamic-resizing policy for the GVR is in effect, a new target size for the GVR (e.g., larger than the original size) may be computed, e.g., based on the analysis of the collected metrics in the depicted embodiment (block 1010). Depending on the new target size, more memory may be allocated for the GRV, or some of the memory being used may be freed up (block 1013). Metrics collection may be continued in operations corresponding to block 1007, and additional resizing may be performed as needed in some embodiments. In at least one embodiment, a machine learning algorithm may be used to analyze the collected metrics' relationships with GVR size, and to recommend sizing changes based on the analysis.

Figure 11:
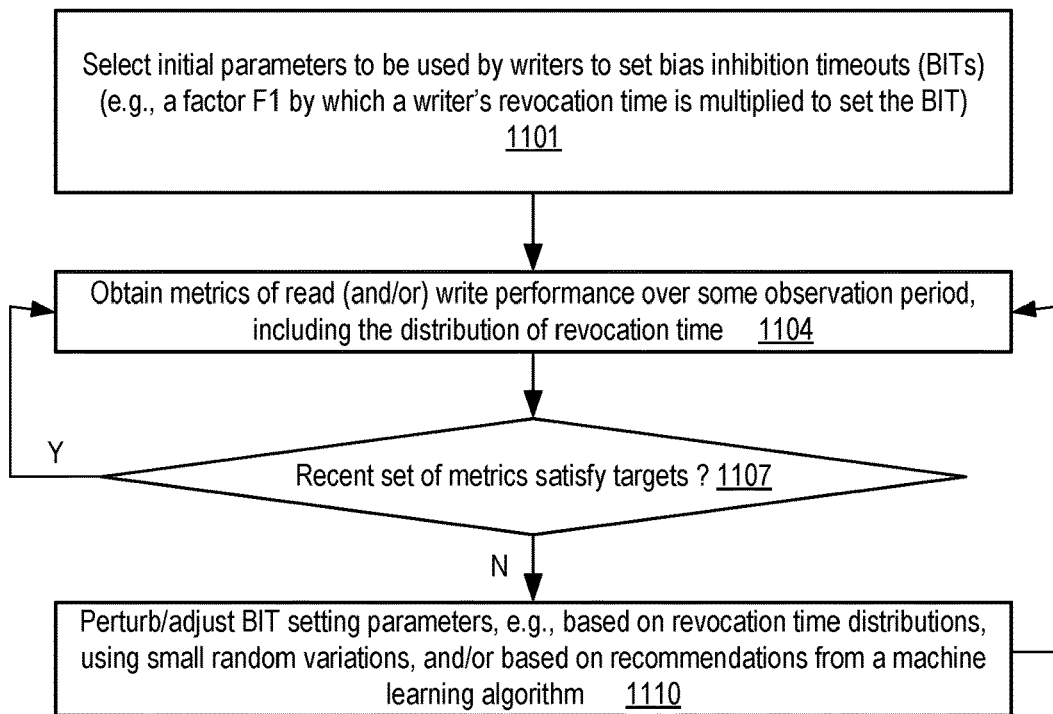
FIG. 11 is a flow diagram illustrating aspects of operations which may be performed to set bias inhibition timeouts in an environment in which a reader bias based algorithm is implemented, according to at least some embodiments.

FIG. 11 is a flow diagram illustrating aspects of operations which may be performed to set bias inhibition timeouts in an environment in which a reader bias based algorithm is implemented, according to at least some embodiments. As mentioned earlier, checking whether the bias inhibition timeout interval for an SDO has expired may represent one example of a reset condition that may be checked by readers (or writers) to re-enable fast paths for readers in different embodiments. Values of an initial set of one or more parameters to be used by writers to set bias inhibition timeouts (BITs) may be selected (block 1101), such as a factor F1 (similar to the variable N used in EPS3) by which the revocation time (time that a writer uses to scan the GVR and/or wait for GVR entries to be cleared) is multiplied to set the BIT.

As readers and writers access the SDOs, metrics of read and/or write performance, including for example the distribution of writer revocation time over some time period may be collected over some observation period (block 1104). If the metrics do not satisfy some target criteria (as detected in block 1107), in at least some embodiments the BIT setting parameters may be adjusted (block 1110). Such adjustments/ perturbations may for example be random variations, values selected based on revocation time distributions (rather than, for example, on worst-case revocation times), or values selected based on recommendations may machine learning algorithms in some embodiments. If the metrics do satisfy the targets, no changes may be applied to the BIT selection parameters in the depicted embodiment. Additional metrics may be collected (e.g., after any changes are applied, or even if no changes are made) (block 1104), the metrics may once again be compared to targets, and the parameter settings may be adjusted as needed over time in various embodiments. Similar adaptive algorithms to those discussed in the context of FIG. 9 and FIG. 10 may be used for other parameters of the RBB and/or GSP techniques in some embodiments. In some embodiments, as indicated earlier, the values of BITs may be set by entities other than writers (e.g., by a background system process or thread).

It is noted that in various embodiments, at least some operations other than those illustrated in the flow diagrams of FIG. 2, FIG. 3, FIG. 7, FIG. 8, FIG. 10, and/or FIG. 11 may be performed to implement the locking-related techniques described above. Some of the operations shown may not be implemented in some embodiments, may be implemented in a different order, or in parallel rather than sequentially.

In some embodiments, aspects of the RBB and GSP algorithms described above may be combined. In one embodiment, for example, another lock such as a mutex may be added to individual ones of the RBBLocks shown in EPS3. An arriving writer may first acquire such a mutex, resolving any write-write conflicts on the targeted SDO. The writer may then perform revocation, if necessary; acquire the underlying/embedded read-write lock with write permission; execute the writer critical section; and then release both the mutex and the underlying/embedded lock in such an embodiment. The embedded read-write lock may resolve reader-writer conflicts. By applying such a mutex-based optimization to RBB, revocation costs may be mitigated by allowing readers to flow through the slow path while revocation is in progress (in contrast to the baseline RBB algorithm introduced above, in which arriving readers are blocked while a revocation is in progress). Allowing readers to use the slow path (involving acquiring the embedded read-write lock) while the revocation is in progress is analogous to how a slow path is introduced in GSP to achieve a similar goal. In addition to further improving overall read performance, such an optimization may also reduce variance in the latency of read operations in at least some embodiments. Such a technique may be applied to other existing locks, such as the Linux brlocks mentioned earlier, in some embodiments.

In various embodiments, implementations of the RBB locking algorithm and/or the GSP locking algorithm described above may be incorporated into dynamic locking libraries made available within various versions of operating systems (such as versions of Linux). In at least one embodiment, a set of interposition libraries (similar to the LD_PRELOAD libraries of some versions of Linux) that expose standard locking application programming interfaces (APIs) (such as the POSIX pthread_rwlock_t API) may be used for exposing the RBB and/or GSP algorithms to applications. In an embodiment in which interposition libraries are used, the application code may not have to be modified or recompiled to take advantage of the capabilities of the algorithms described herein; instead, the algorithms may be deployed simply by changing an environment variable (e.g., the LD_PRELOAD environment variable).

As one skilled in the art will appreciate in light of this disclosure, certain embodiments in which one or both of the locking techniques introduced above are implemented may be capable of achieving various advantages, including enabling substantially higher throughputs for certain types of data access workloads (e.g., read-mostly workloads at operating systems, database systems, and the like) with minimal increases in memory footprint required for lock-related metadata. A variety of use cases may benefit from the techniques, such as workloads of key-value database systems in which reads typically outnumber writes by a substantial margin, operations directed to certain file system objects in commonly-used operating systems, and the like. In Linux-based (and/or other similar) operating systems, for example, mostly-read workloads that may benefit from the described techniques may be directed at structures protected by vfsmount_lock, which is acquired in read mode for pathname lookups (extremely frequent and performance critical operations), and acquired in write mode only for rare events involving mounting/unmounting file systems. Applications that originally did not scale well on NUMA architectures, where the costs of cache misses relative to cache hits may be even higher than in some conventional computing environments, may be able to successfully scale on larger NUMA configurations using the described techniques in at least one embodiment. Furthermore, the enhanced locking techniques described may be deployed in at least some embodiments (e.g., using dynamic libraries in the manner indicated above) without requiring existing application code to be modified, which is a significant benefit for long-running applications in production environments. In some embodiments in which SIMD instructions are available for use, the RBB algorithm may provide even greater performance improvements, as the cost of bias revocation may be reduced using such instructions.

Figure 12:
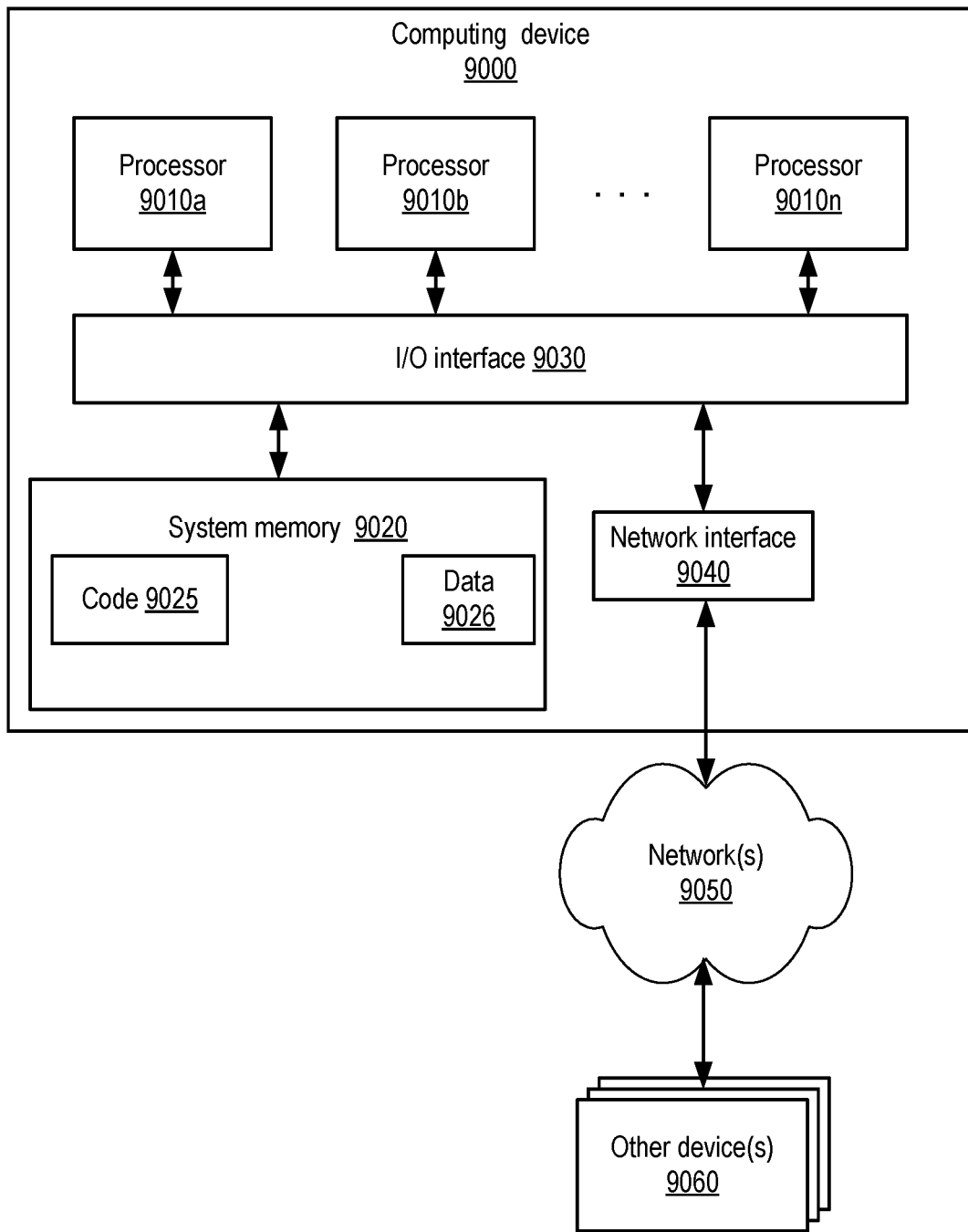
FIG. 12 is a block diagram illustrating an example computing device that may be used in at least some embodiments.

In at least some embodiments, a server that implements a portion or all of one or more of the technologies described herein, including the GSP locking and/or RBB algorithms may include a general-purpose computer system that includes or is configured to access one or more computer-accessible media. FIG. 12 illustrates such a general-purpose computing device 9000. In the illustrated embodiment, computing device 9000 includes one or more processors 9010 coupled to a system memory 9020 (which may comprise both non-volatile and volatile memory modules) via an input/output (I/O) interface 9030. Computing device 9000 further includes a network interface 9040 coupled to I/O interface 9030.

In various embodiments, computing device 9000 may be a uniprocessor system including one processor 9010, or a multiprocessor system including several processors 9010 (e.g., two, four, eight, or another suitable number). Processors 9010 may be any suitable processors capable of executing instructions. For example, in various embodiments, processors 9010 may be general-purpose or embedded processors implementing any of a variety of instruction set architectures (ISAs), such as the x86, PowerPC, SPARC, or MIPS ISAs, or any other suitable ISA. In multiprocessor systems, each of processors 9010 may commonly, but not necessarily, implement the same ISA. In some implementations, graphics processing units (GPUs) may be used instead of, or in addition to, conventional processors. NUMA architectures may be used in some embodiments.

System memory 9020 may be configured to store instructions and data accessible by processor(s) 9010. In at least some embodiments, the system memory 9020 may comprise both volatile and non-volatile portions; in other embodiments, only volatile memory may be used. In various embodiments, the volatile portion of system memory 9020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 9020 as code 9025 (which may for example comprise the code for RBB and/or GSP algorithms) and data 9026 (which may for example include the shared data objects whose accesses are protected using the RBB and/or GSP algorithms, locking related metadata and the like).

In one embodiment, I/O interface 9030 may be configured to coordinate/O traffic between processor 9010, system memory 9020, and any peripheral devices in the device, including network interface 9040 or other peripheral interfaces such as various types of persistent and/or volatile storage devices. In some embodiments, I/O interface 9030 may perform any necessary protocol, timing or other data transformations to convert data signals from one component (e.g., system memory 9020) into a format suitable for use by another component (e.g., processor 9010). In some embodiments, I/O interface 9030 may include support for devices attached through various types of peripheral buses, such as a variant of the Peripheral Component Interconnect (PCI) bus standard or the Universal Serial Bus (USB) standard, for example. In some embodiments, the function of I/O interface 9030 may be split into two or more separate components, such as a north bridge and a south bridge, for example. Also, in some embodiments some or all of the functionality of I/O interface 9030, such as an interface to system memory 9020, may be incorporated directly into processor 9010.

Network interface 9040 may be configured to allow data to be exchanged between computing device 9000 and other devices 9060 attached to a network or networks 9050, such as other computer systems or devices as illustrated in FIG. 1 through FIG. 11, for example. In various embodiments, network interface 9040 may support communication via any suitable wired or wireless general data networks, such as types of Ethernet network, for example. Additionally, network interface 9040 may support communication via telecommunications/telephony networks such as analog voice networks or digital fiber communications networks, via storage area networks such as Fibre Channel SANs, or via any other suitable type of network and/or protocol.

In some embodiments, system memory 9020 may be one embodiment of a computer-accessible medium configured to store program instructions and data as described above for FIG. 1 through FIG. 11 for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 9000 via I/O interface 9030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 9000 as system memory 9020 or another type of memory. In some embodiments, one or more computer-accessible storage media may comprise instructions that when executed on or across one or more processors implement the techniques described. Further, a computer-accessible medium may include transmission media or signals such as electrical, electromagnetic, or digital signals, conveyed via a communication medium such as a network and/or a wireless link, such as may be implemented via network interface 9040. Portions or all of multiple computing devices such as that illustrated in FIG. 12 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

Figure 13:
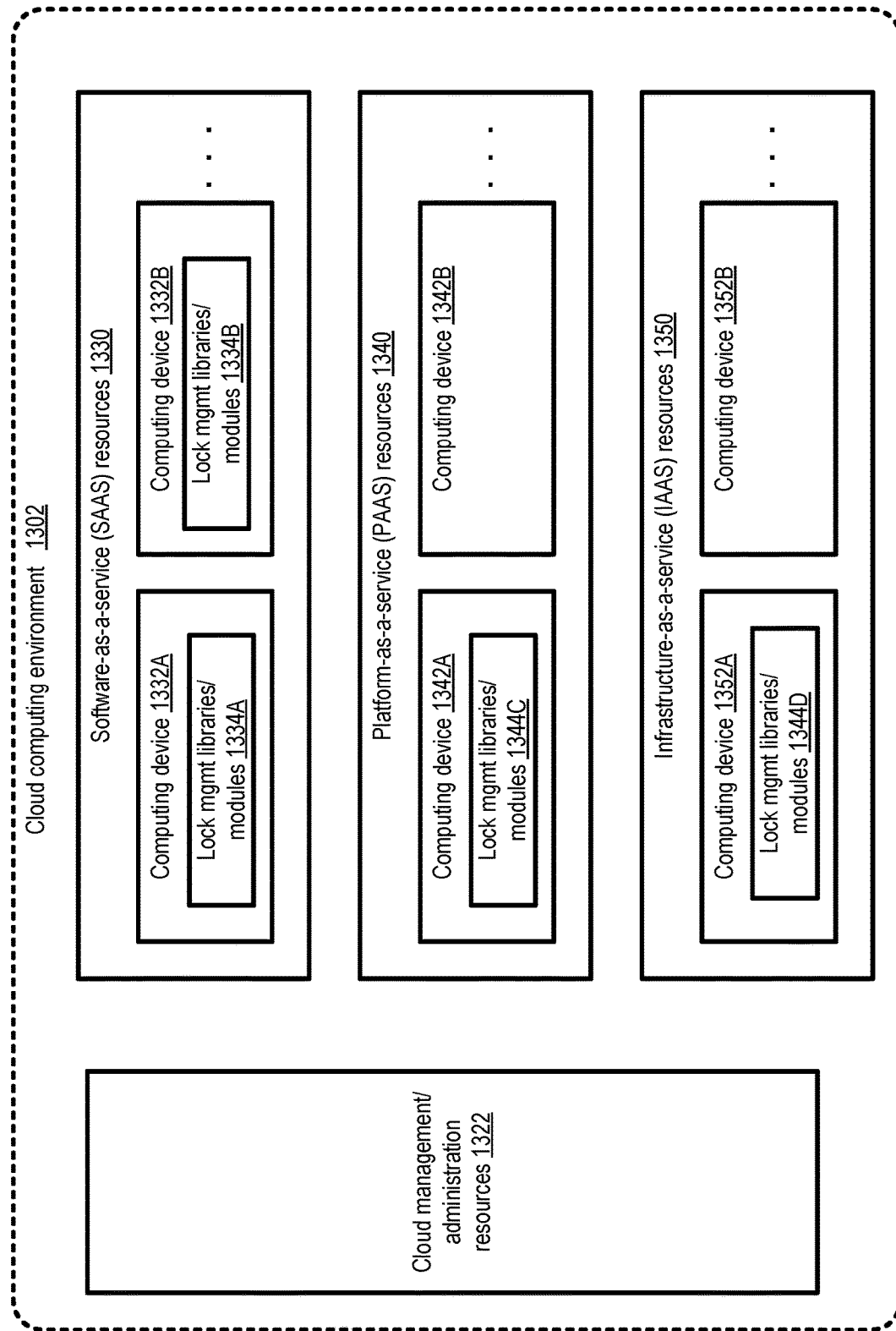
FIG. 13 illustrates an example cloud computing environment in which enhanced locking techniques to improve read concurrency may be employed, according to at least some embodiments.

FIG. 13 illustrates an example cloud computing environment in which enhanced locking techniques to improve read concurrency may be employed, according to at least some embodiments As shown, cloud computing environment 1302 may include cloud management/administration resources 1322, software-as-a-service (SAAS) resources 1330, platform-as-a-service (PAAS) resources 1340 and/or infrastructure-as-a-service (IAAS) resources 1350. Individual ones of the these subcomponents of the cloud computing environment 1302 may include a plurality of computing devices (e.g., devices similar to device 9000 shown in FIG. 12) distributed among one or more data centers in the depicted embodiment, such as devices 1332A, 1332B, 1342A, 1342B, 1352A, and 1352B. A number of different types of network-accessible services, such as database services, customer-relationship management services, machine learning services and the like may be implemented using the resources of the cloud computing environment in various embodiments.

In the depicted embodiment, clients or customers of the cloud computing environment 1302 may choose the mode in which they wish to utilize one or more of the network-accessible services offered. For example, in the IAAS mode, in some embodiments the cloud computing environment may manage virtualization, servers, storage and networking on behalf of the clients, but the clients may have to manage operating systems, middleware, data, runtimes, and applications. If, for example, a client wishes to use IAAS resources 1350 for some desired application for which locking techniques of the kind described earlier are used, the clients may identify one or more virtual machines implemented using computing devices 1352 (e.g., 1352A or 1352B) as the platforms on which the applications are being run, and ensure that the appropriate lock management libraries/modules 1344D which implement RBB and/or GSP algorithms or their variants are installed/available on those virtual machines. In the PAAS mode, clients may be responsible for managing a smaller subset of the software/hardware stack in various embodiments: e.g., while the clients may still be responsible for application and data management, the cloud environment may manage virtualization, servers, storage, network, operating systems as well as middleware.

Lock management libraries/modules such as 1344C may be pre-deployed to, and run at, at least some PAAS resources (e.g., 1342A, 1342B etc.) for applications on various clients in different embodiments. In the SAAS mode, the cloud computing environment may offer applications as a pre-packaged service (including the underlying lock management components such as 1334A or 1334B), managing even more of the software/hardware stack in various embodiments—e.g., clients may not even have to explicitly manage applications or data.

The administration resources 1322 may perform resource management-related operations (such as provisioning, network connectivity, ensuring fault tolerance and high availability, and the like) for all the different modes of cloud computing that may be supported in some embodiments. Clients may interact with various portions of the cloud computing environment using a variety of programmatic interfaces in different embodiments, such as a set of APIs (application programming interfaces), web-based consoles, command-line tools, graphical user interfaces and the like. Note that other modes of providing services at which the locking algorithms described earlier may be supported in at least some embodiments, such as hybrid public-private clouds and the like.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A computer-implemented method, comprising:
   storing respective sets of locking-related metadata pertaining to individual ones of one or more data objects, wherein a set of locking-related metadata pertaining to a first data object of the one or more data objects comprises (a) a first lock and (b) a first read-related condition indicator;
   determining, by a first reader of a plurality of accessors of the first data object, based at least in part on examining the first read-related condition indicator, that a read operation on the first data object can be performed without acquiring the first lock; and
   initiating the read operation by the first reader without acquiring the first lock.

2. The computer-implemented method as recited in claim 1, further comprising:
   identifying, by the first reader using one or more selection functions prior to initiating the read operation, a particular element within a readers data structure; and
   storing, by the first reader in the particular element, an indication that the first reader has obtained read access to the first data object.

3. The computer-implemented method as recited in claim 2, wherein a particular selection function of the one or more selection functions comprises a hash function, and wherein an input provided to the hash function by the first reader comprises one or more of: (a) an identifier of the first reader, (b) an identifier of the first data object or (c) an identifier of the first lock.

4. The computer-implemented method as recited in claim 2, wherein a particular selection function of the one or more selection functions comprises a time-based mapping function to which a timestamp associated with the read operation is provided as input.

5. The computer-implemented method as recited in claim 2, wherein a particular selection function of the one or more selection functions comprises a random-number based element selection function.

6. The computer-implemented method as recited in claim 2, wherein the one or more selection functions comprise a first selection function and a second selection function, and wherein said identifying the particular element within the readers data structure by the first reader using the one or more selection functions comprises:
   invoking the first selection function by the first reader;
   determining, by the first reader, that another element of the readers structure, identified by the first selection function, is occupied; and
   invoking the second selection function by the first reader in response to determining that the other element of the readers structure is occupied, wherein the particular element is identified by the second selection function.

7. The computer-implemented method as recited in claim 1, further comprising:
   storing, by the first reader in a readers structure prior to initiating the read operation, an indication in a readers structure that the first reader has acquired read access to the first data object; and
   verifying, by the first reader, after storing the indication and prior to initiating the read operation, that the first read-related condition indicator has not been modified since the first read-related condition indicator was examined by the first reader.

8. A system, comprising:
   one or more computing devices;
   wherein the one or more computing devices include instructions that upon execution on or across one or more processors:
      store respective sets of locking-related metadata pertaining to individual ones of one or more data objects, wherein a set of locking-related metadata pertaining to a first data object of the one or more data objects comprises (a) a first lock and (b) a first read-related condition indicator; and
      cause a first reader of a plurality of accessors of the first data object to:
         determine, based at least in part on examining the first read-related condition indicator by the first reader, that a read operation on the first data object can be performed without acquiring the first lock; and
         initiate the read operation without acquiring the first lock.

9. The system as recited in claim 8, wherein the one or more computing devices store further instructions that upon execution on or across the one or more processors further cause the first reader to:
   identify, using one or more selection functions prior to initiating the read operation, a particular element within a readers data structure; and
   store, in the particular element, an indication that the first reader has obtained read access to the first data object.

10. The system as recited in claim 9, wherein a particular selection function of the one or more selection functions comprises a hash function, and wherein an input provided to the hash function by the first reader comprises one or more of: (a) an identifier of the first reader, (b) an identifier of the first data object or (c) an identifier of the first lock.

11. The system as recited in claim 9, wherein a particular selection function of the one or more selection functions comprises a time-based mapping function to which a timestamp associated with the read operation is provided as input.

12. The system as recited in claim 9, wherein a particular selection function of the one or more selection functions comprises a random-number based element selection function.

13. The system as recited in claim 9, wherein the one or more selection functions comprise a first selection function and a second selection function, wherein to cause the first reader to identify the particular element within the readers data structure, the one or more computing devices store further instructions that upon execution on or across the one or more processors further cause the first reader to:
 invoke the first selection function;
 determine that another element of the readers structure, identified by the first selection function, is occupied; and
 invoke the second selection function in response to determining that the other element of the readers structure is occupied, wherein the particular element is identified by the second selection function.

14. The system as recited in claim 8, wherein the one or more computing devices store further instructions that upon execution on or across the one or more processors further cause the first reader to:
 store, prior to initiating the read operation, an indication in a readers structure that the first reader has acquired read access to the first data object; and
 verify, after storing the indication and prior to initiating the read operation, that the first read-related condition indicator has not been modified since the first read-related condition indicator was examined by the first reader.

15. One or more non-transitory computer-accessible storage media storing program instructions that when executed on or across one or more processors:
 store respective sets of locking-related metadata pertaining to individual ones of one or more data objects, wherein a set of locking-related metadata pertaining to a first data object of the one or more data objects comprises (a) a first lock and (b) a first read-related condition indicator; and
 cause a first reader of a plurality of accessors of the first data object to:
  determine, based at least in part on examining the first read-related condition indicator by the first reader, that a read operation on the first data object can be performed without acquiring the first lock; and
  initiate the read operation without acquiring the first lock.

16. The one or more non-transitory computer-accessible storage media as recited in claim 15, storing further program instructions that when executed on or across one or more processors further cause the first reader to:
 identify, using one or more selection functions prior to initiating the read operation, a particular element within a readers data structure; and
 store, in the particular element, an indication that the first reader has obtained read access to the first data object.

17. The one or more non-transitory computer-accessible storage media as recited in claim 16, wherein a particular selection function of the one or more selection functions comprises a hash function, and wherein an input provided to the hash function by the first reader comprises one or more of: (a) an identifier of the first reader, (b) an identifier of the first data object or (c) an identifier of the first lock.

18. The one or more non-transitory computer-accessible storage media as recited in claim 16, wherein a particular selection function of the one or more selection functions comprises a time-based mapping function to which a timestamp associated with the read operation is provided as input.

19. The one or more non-transitory computer-accessible storage media as recited in claim 16, wherein a particular selection function of the one or more selection functions comprises a random-number based element selection function.

20. The one or more non-transitory computer-accessible storage media as recited in claim 15, storing further program instructions that when executed on or across one or more processors further cause the first reader to:
 store, prior to initiating the read operation, an indication in a readers structure that the first reader has acquired read access to the first data object; and
 verify, after storing the indication and prior to initiating the read operation, that the first read-related condition indicator has not been modified since the first read-related condition indicator was examined by the first reader.

* * * * *